(12) United States Patent
Sadineni et al.

(10) Patent No.: US 11,790,816 B1
(45) Date of Patent: Oct. 17, 2023

(54) SENSOR INTEGRATED CIRCUIT (IC) WITH OPPOSITE FACING AMBIENT LIGHT SENSOR AND PROXIMITY SENSOR, AND RELATED ELECTRONIC DEVICES AND FABRICATION METHODS

(71) Applicant: QUALCOMM Incorporated, San Diego, CA (US)

(72) Inventors: Venkatesh Sadineni, Hyderabad (IN); Prachir Puri, Hyderabad (IN); Veera Venkata Charan Junnu, Peddapuram (IN)

(73) Assignee: QUALCOMM INCORPORATED, San Diego, CA (US)

(*) Notice: Subject to any disclaimer, the term of this patent is extended or adjusted under 35 U.S.C. 154(b) by 0 days.

(21) Appl. No.: 17/930,121

(22) Filed: Sep. 7, 2022

(51) Int. Cl.
   *G09G 3/00* (2006.01)
   *G01J 1/42* (2006.01)
   *H01L 23/00* (2006.01)

(52) U.S. Cl.
   CPC .......... *G09G 3/003* (2013.01); *G01J 1/4204* (2013.01); *G09G 2354/00* (2013.01); *G09G 2360/141* (2013.01); *G09G 2360/144* (2013.01); *H01L 24/01* (2013.01); *H01L 2221/68313* (2013.01)

(58) Field of Classification Search
   CPC .......... G09G 3/003; G09G 2360/141; G09G 2360/144; G01J 1/4204; H01L 24/01; H01L 2221/68313
   See application file for complete search history.

(56) References Cited

U.S. PATENT DOCUMENTS

| | | | |
|---|---|---|---|
| 2017/0199396 A1* | 7/2017 | Knoll | G02F 1/13318 |
| 2018/0188105 A1* | 7/2018 | Huang | H01L 31/02002 |
| 2019/0045100 A1* | 2/2019 | Michishita | H04N 5/33 |
| 2019/0302445 A1* | 10/2019 | Cho | G02B 5/005 |
| 2020/0082790 A1* | 3/2020 | Moore | G09G 5/10 |
| 2020/0219431 A1* | 7/2020 | Lee | G02B 27/0172 |

* cited by examiner

*Primary Examiner* — Brent D Castiaux
(74) *Attorney, Agent, or Firm* — Withrow & Terranova, PLLC

(57) ABSTRACT

A sensor integrated circuit (IC) employing opposite facing ambient light sensor and proximity sensor, and related electronic devices and fabrication methods. As an example, the sensor IC can be integrated into an electronic device (e.g., a wearable device) to detect the proximity of a user and ambient light to control functions of the electronic device. To provide for the proximity sensor and the ambient light sensor to disposed in the sensor IC face outward in different (e.g., opposite) directions in a package to align towards a user and the user's experience of ambient light, the proximity sensor and the ambient light sensor are disposed on different sides of the sensor IC. In this manner, the ambient light sensor can be facing in the direction of ambient light perceived by a user of the electronic device, and the proximity sensor detect the user from a different side of the electronic device.

34 Claims, 18 Drawing Sheets

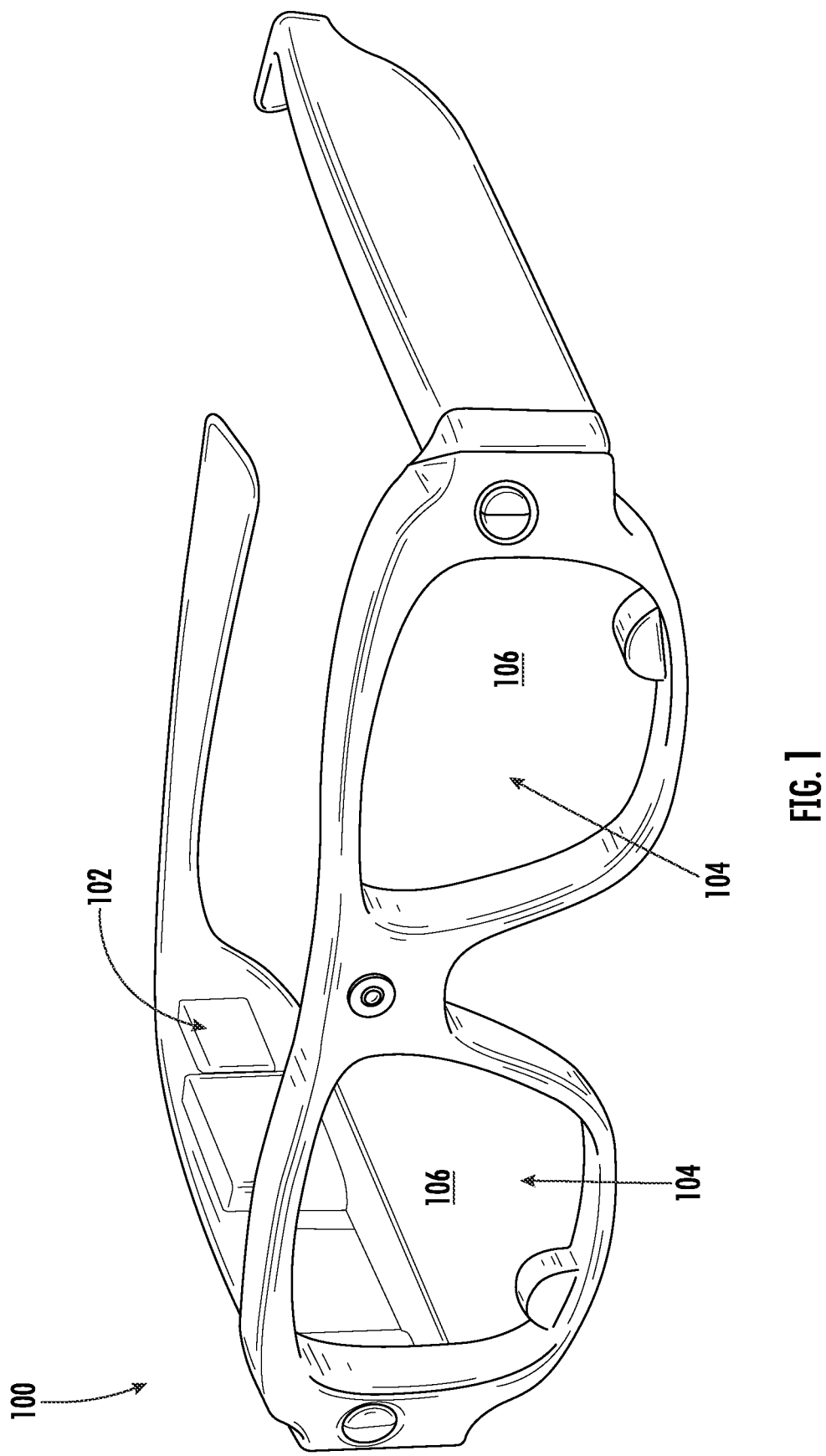

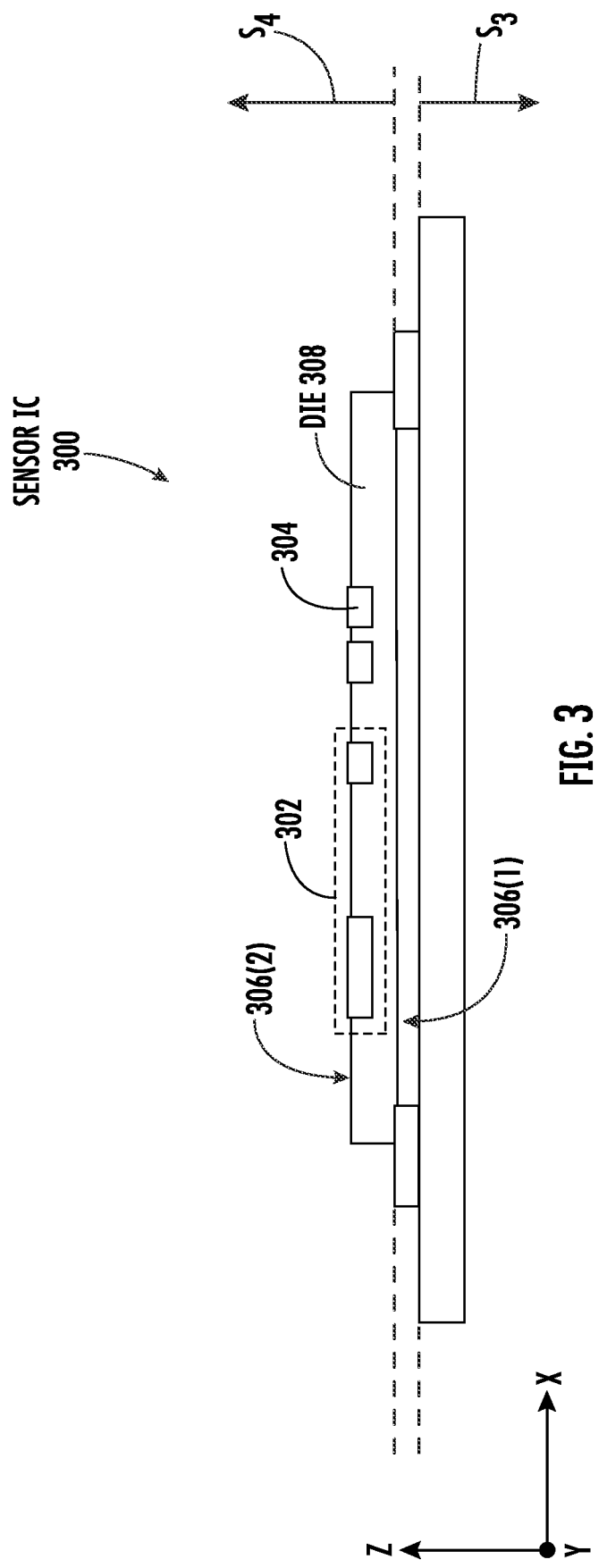

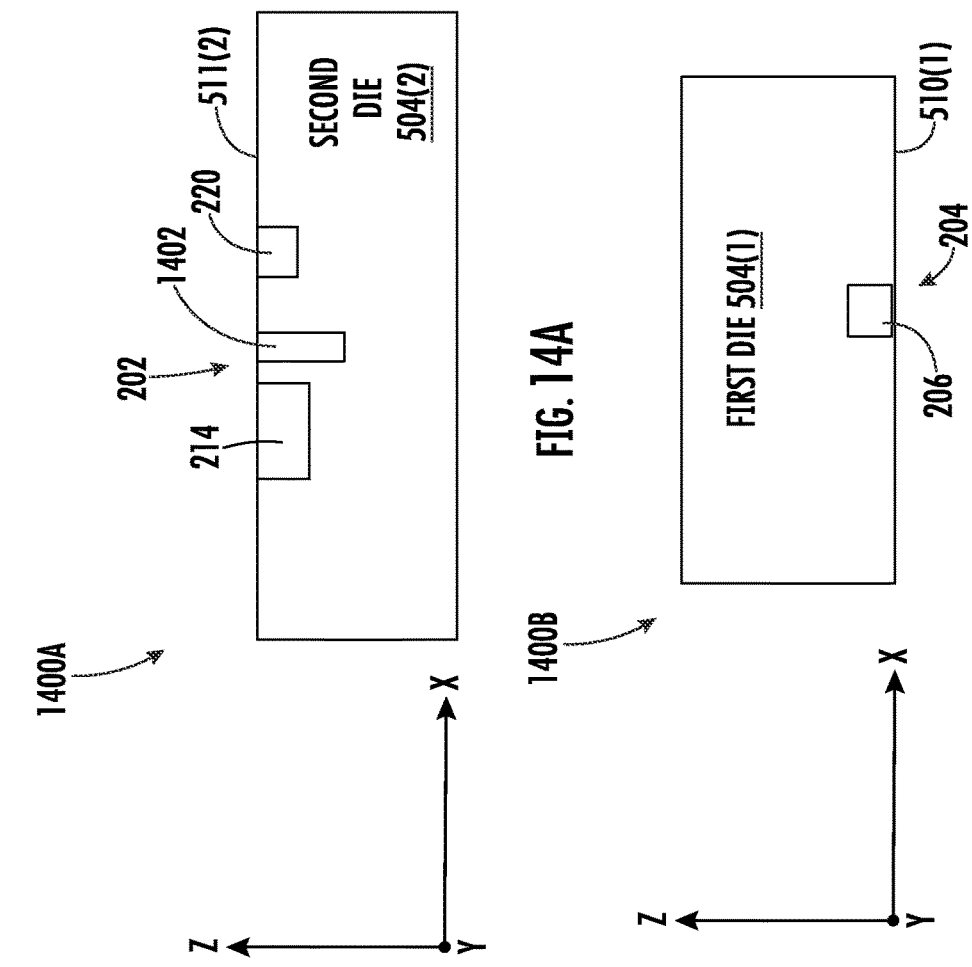
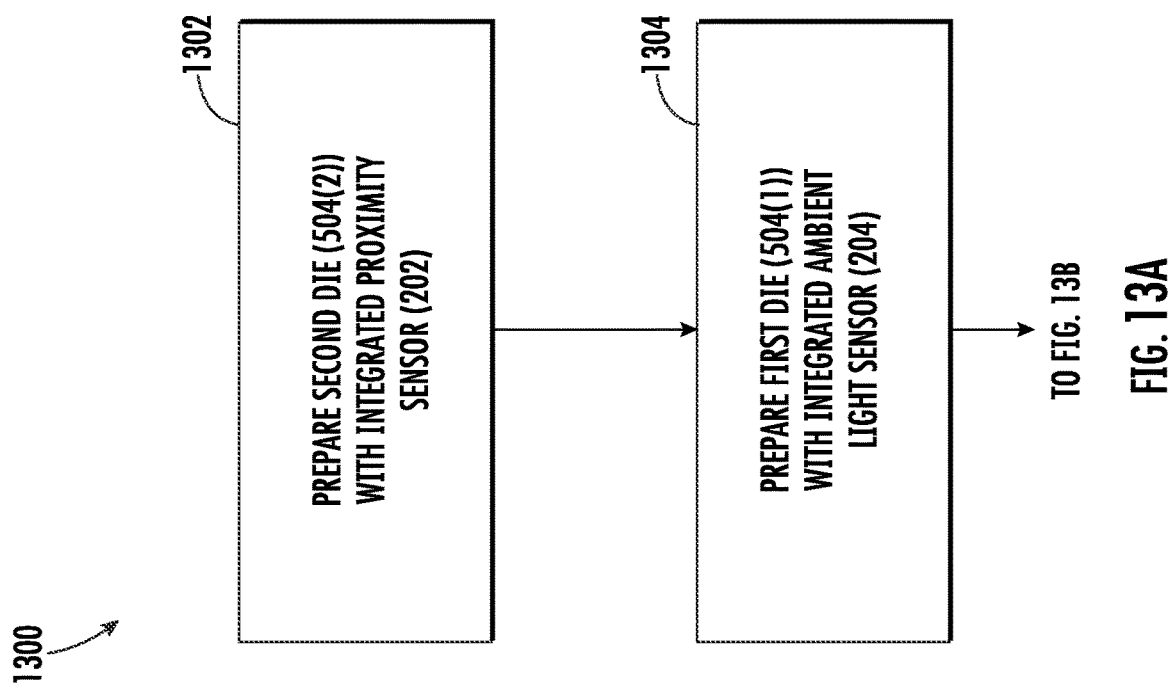

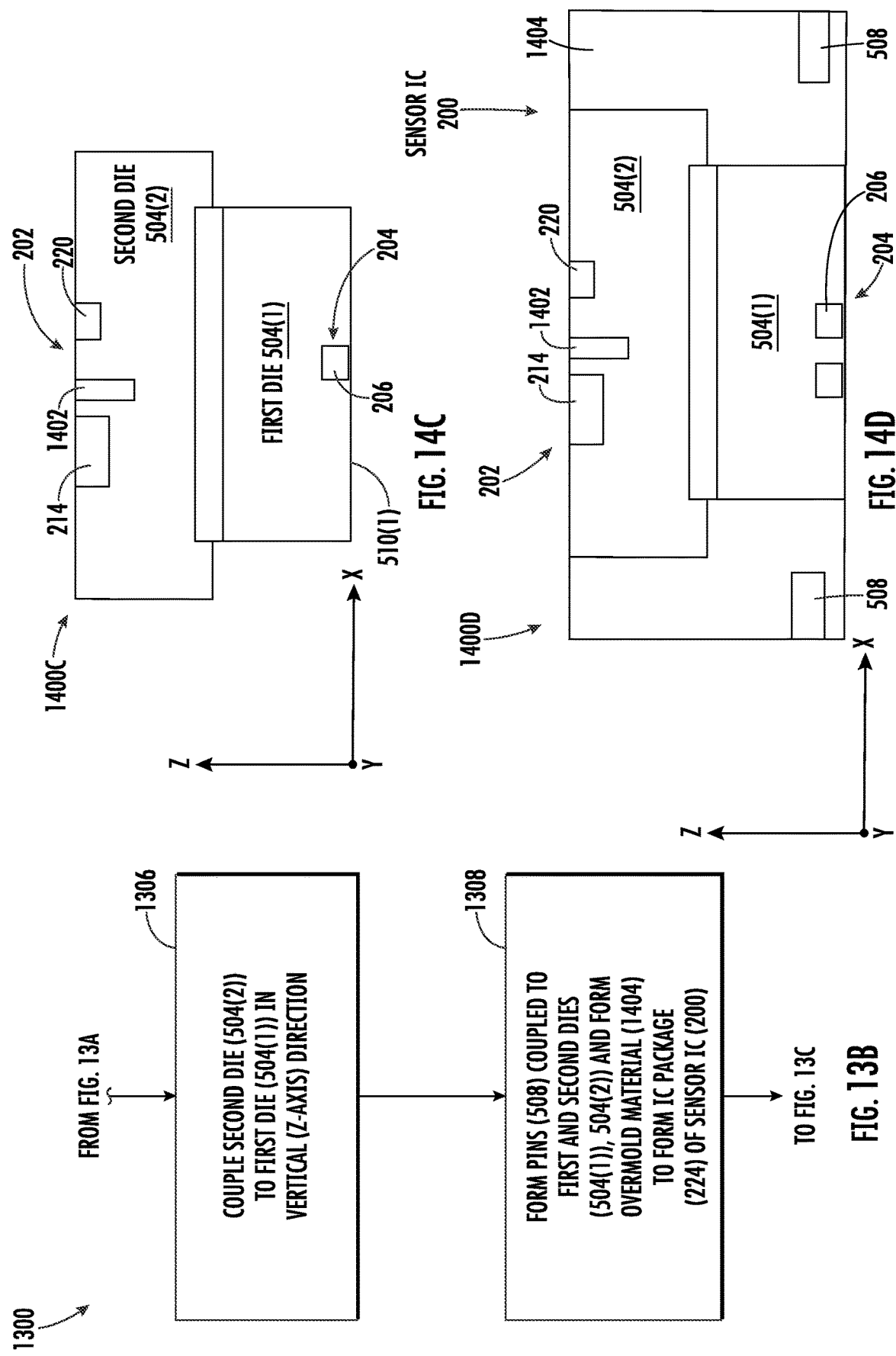

SENSOR INTEGRATED CIRCUIT (IC) WITH OPPOSITE FACING AMBIENT LIGHT SENSOR AND PROXIMITY SENSOR, AND RELATED ELECTRONIC DEVICES AND FABRICATION METHODS

BACKGROUND

Field of the Disclosure

The field of the disclosure relates to electronic devices, such as reality computing devices, that incorporate an ambient sensor for detecting ambient light for controlling brightness of a display, and a proximity sensor for detecting a user for control of an operating mode of the electronic device.

II. Background

Computing devices may be used for extended reality applications, including virtual reality (VR), augmented reality (AR), and extended reality (XR) applications. For example, reality computing devices can display an imaged real world object on a screen along with computer generated information, such as an image or textual information. VR is a simulated experience that can be similar to or completely different from the real world. AR is a technology that alters your perception of reality by digitally superimposing information onto live camera feed. XR, on the other hand, blends the physical and the virtual worlds together and extends them all the way out to the background and beyond. Mobile computing devices can be used as computing devices for reality devices while also providing users with access to a variety of information via wireless communication systems. One example of a reality mobile computing device is an electronic device in the form of head-mounted XR glasses, such as the XR glasses 100 shown FIG. 1. The XR glasses 100 are an electronic computing device that includes a computing device 102 that controls an integrated display 104 that is integrated into the lenses 106 that allows the user to see either VR images and/or real world with objects added by the computing device 102.

Reality computing devices can include an integrated circuit (IC) that includes an ambient light sensor(s) and a proximity sensor(s) for addressing certain functionalities. An ambient light sensor is used in a reality computing device to detect ambient light conditions of the reality device. A reality computing device can include an electronic device that can control the brightness of a display based on ambient lighting conditions detected by the ambient light sensor. An ambient light sensor is typically integrated in a reality computing device such that the ambient light sensor(s) is facing outwards from the user so that the ambient light sensor detects light from the same general direction as received by the user. A proximity sensor is integrated in a reality computing device to detect if the user is wearing the reality computing device (e.g., if the reality computing device is glasses or a head mask). A reality computing device can control its operating mode based on the proximity sensor detecting the user as an object. For example, if the proximity sensor detects a user, the reality computing device can transition to an active power mode where the reality computing device can operate with higher power consumption to operate at a higher performance level. If the proximity sensor no longer detects a user as a determined period of time, the reality computing device can transition to an idle or sleep power mode to conserve power since higher performance is not a concern in this mode. A proximity sensor is typically integrated in a reality computing device such that the proximity sensor is facing towards the user (e.g., user facing) according to how the reality computing device would be oriented if worn by a user, so that the proximity sensor can detect use of the reality computing device by a user.

SUMMARY OF THE DISCLOSURE

Aspects disclosed herein include a sensor integrated circuit (IC) employing an opposite facing ambient light sensor and a proximity sensor. Related electronic devices and fabrication methods are also disclosed. The sensor IC may be included in a reality computing electronic device as an example, such as a user mobile and/or wearable reality computing device. The ambient light sensor receives ambient light in an ambient field of view of the ambient light sensor in the environment of the sensor IC. As an example, an electronic device that includes the sensor IC may adjust the brightness of its display(s) based on the amount of detected ambient light by the ambient light sensor. The proximity sensor is configured to emit light at a field angle in an emission field from the sensor IC and also detect returned emitted light that is reflected or scattered from another object, such as a user, in its proximity field of view. As another example, an electronic device that includes the sensor IC can adjust its operating mode based on detecting the amount of returned emitted light as an indication of a detected user of the electronic device. It may be important for a proximity sensor and an ambient light sensor to be facing outward in different and/or opposite directions from each other due to an electronic device's inherent configuration, whereby a user of the electronic device would be detected from one side of the electronic device opposite of a side where the user would perceive ambient light. Thus, in exemplary aspects, a sensor IC is provided that includes a proximity sensor and ambient light sensor disposed adjacent to different (e.g., opposing) respective sides of the sensor IC. The proximity sensor and the ambient light sensor can be disposed in the sensor IC to face outward in opposite directions from each other in a single package. As an example, this arrangement can also make a wearable electronic device that incorporates the sensor IC more ergonomically feasible for integration in wearable devices, because the orientation of the proximity sensor and ambient light sensor in the sensor IC on different (e.g., opposing) sides can automatically align towards the user and the user's experience of ambient light as the wearable electronic device is designed to be worn. Further, by the proximity sensor and the ambient light sensor being disposed as integrated components in a single sensor IC facing in different directions, the extra cost and/or area of having to provide such sensors in multiple packages to enable such sensors being disposed in an electronic device to face outward in different directions may be avoided.

Also, in other exemplary aspects, by the proximity sensor and ambient light sensor being disposed adjacent to different (e.g., opposing) respective sides of the sensor IC, the ambient field of view of the ambient light sensor and the emission field of the proximity sensor can be non-overlapping. This is so that light emitted by the proximity sensor is either not received, or is received in a reduced intensity, by the ambient light sensor as an erroneous indication of ambient light. This can improve the accuracy of ambient light detection by the ambient light sensor, which in turn can allow for an electronic device that incorporates the sensor IC to adjust the brightness of a display(s) based on an accurate detection of ambient light.

In one exemplary aspect, the ambient light sensor of the sensor IC includes an ambient visible light receiver (e.g., a PD) that is configured to receive visible light in an ambient field of view in a first direction towards a first side of the sensor IC to detect ambient light in the ambient field of view. The proximity sensor of the sensor IC includes a proximity light emitter (e.g., a light emitting diode (LED)) that is configured to emit light (e.g., infrared (IR) light) in an emission field in a second direction opposite the first direction and outward from a second side of the sensor IC package. For example, the first and second sides of the sensor IC may be opposing sides. The proximity sensor also includes a proximity light receiver (e.g., a photodetector (PD)) that is configured to receive the light (e.g., infrared (IR) light) emitted from the proximity light that is returned in its proximity field of view in a first direction towards the second side of the IC, to allow detection of an object in proximity to the IC.

Further, because the ambient visible light receiver may be sensitive to also receive ambient IR light, the sensor IC can also include an optional ambient IR light receiver disposed on the second side of the sensor IC and configured to receive ambient IR light. An electronic device incorporating the sensor IC can use the detected level of IR light by the ambient optional IR light receiver to compensate (e.g., reduce or remove) the IR light received by the ambient visible light receiver. As another example, an optical filter could be provided that is disposed in the ambient field of view of the ambient visible light receiver to filter out or reduce the amount IR light received by the ambient visible light receiver.

In another exemplary aspect, the sensor IC includes a circuit board and one or more semiconductor dies ("dies") that are mounted on the circuit board. The proximity sensor and ambient light sensor may share the circuit board as a common circuit board to limit pins, area, and cost of the sensor IC package. In one example, the ambient light sensor is disposed adjacent to a first die in the sensor IC package, and the proximity sensor is disposed adjacent to a second die in the sensor IC package. The second die, as a top die, can be stacked on top of a first die, as a bottom die, vertically as a three-dimensional (3D) stacked die module, wherein a first, bottom side of the first die is disposed or coupled on a first, top surface of the circuit board. The first, bottom side of the first die is opposite of the second, top side of the second die. In another example, the first and second dies can be disposed adjacent to each other, side-by-side, with each of their first, bottom sides disposed on or coupled to the first, top surface of the circuit board. The first, bottom sides of the first and second dies are adjacent to the top surface of the sensor IC package, and the second, top sides of the first and second dies are sides opposing their respective first, bottom sides. The ambient light sensor is disposed on or adjacent to the first, bottom side of the first die such that its ambient field of view is in a first direction outward from a first side of the sensor IC package. The proximity sensor is disposed on or adjacent to the second, top side of second die on the second side of the sensor IC such that its proximity emission field is in a second direction opposite of the first direction and outward from the second side of the sensor IC package. In this manner, the light emitted by the proximity sensor is in the proximity emission field in the second direction outwards from the second side of the sensor IC and outside of the ambient field of view of the ambient sensor.

In another example, to provide an ambient field of view for the ambient sensor that is not obstructed by the circuit board, a light pipe is provided in the circuit board. In an example, the light pipe comprises an opening that extends between the first and second surfaces of the circuit board, wherein the opening is adjacent to the ambient sensor. The opening forms the ambient field of view of the ambient light sensor. In this manner, the ambient light sensor can receive ambient light in the first direction directed towards the first side of sensor IC and the second surface of the circuit board, through the opening of the circuit board forming the ambient field of view. The diameter of the opening can be sized to control the desired angle for the ambient field of view as a filtering (i.e., blocking) method. In another example, an optical filter can be disposed in or over the opening on the second surface of the circuit board to filter light of wavelengths that are contained in the light emitted by the proximity sensor.

In this regard, in one exemplary aspect, an IC is provided. The IC comprises a first die comprising a first side and a second side opposite the first side. The IC also comprises an ambient light sensor adjacent to the first side of the first die, the ambient light sensor facing outward from the first side of the first die in a first direction. The IC also comprises a proximity sensor adjacent to the second side of the first die, the proximity sensor facing outward from the second side of the first die in a second direction opposite from the first direction.

In another exemplary aspect, a method of fabricating an IC is provided. The method comprises providing a first die comprising a first side and a second side opposite the first side. The method also comprises coupling an ambient light sensor adjacent to the first side of the first die facing outward from the first side of the first die in a first direction. The method also comprises coupling a proximity sensor adjacent to the second side of the first die facing outward from the second side of the first die in a second direction opposite from the first direction.

In another exemplary aspect, an electronic device is provided. The electronic device comprises a computing device, and a display coupled to the computing device. The electronic device also comprises an IC coupled to the computing device. The IC comprises a first die comprising a first side and a second side opposite the first side. The IC also comprises an ambient light sensor adjacent to the first side of the first die, the ambient light sensor facing outward from the first side of the first die in a first direction. The IC also comprises a proximity sensor adjacent to the second side of the first die, the proximity sensor facing outward from the second side of the first die in a second direction opposite from the first direction. The ambient light sensor is configured to receive visible light in an ambient field of view in the second direction towards the first side of the first die, and generate an ambient light signal comprising ambient light information indicating an amount of received visible light. The proximity sensor is configured to emit a first light in an emission field in the first direction outward from the second side of the first die, receive at least a portion of the first light returned in a proximity field of view in the second direction towards the second side of the first die and generate a proximity signal comprising proximity information indicating a proximity of an object to the IC. The computing device is configured to receive the ambient light signal, control a brightness of the display based on the ambient light information in the ambient light signal, receive the proximity signal, and control an operational mode of the computing device based on the proximity information in the proximity signal.

BRIEF DESCRIPTION OF THE FIGURES

FIG. 1 is a perspective view of an exemplary electronic device in the form of wearable reality computer glasses that include an integrated computing system for controlling an integrated display;

FIG. 3 is a side view of a sensor IC that includes an ambient light sensor and a proximity sensor facing the same direction from the sensor IC;

FIGS. 13A-13C is a flowchart illustrating another exemplary fabrication process of fabricating a sensor IC that includes an opposite facing proximity sensor and an ambient light sensor, including but not limited to the sensor ICs in FIGS. 2A-2B and 4-8;

FIGS. 14A-14E are exemplary fabrication stages during fabrication of a sensor IC according to the exemplary fabrication process in FIGS. 13A-13C.

DETAILED DESCRIPTION

Figure 2A:
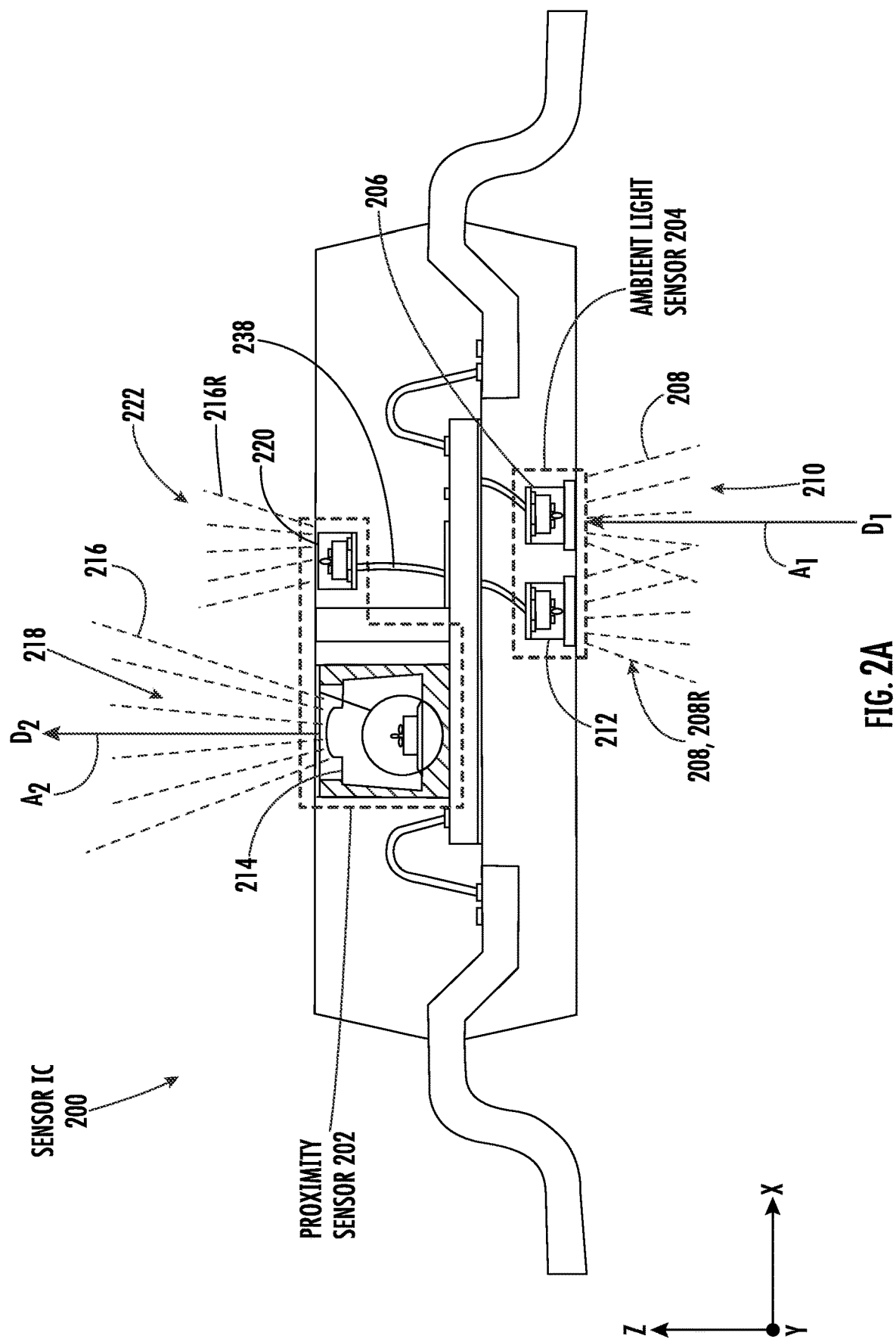
FIGS. 2A and 2B are side views of an exemplary sensor integrated circuit (IC) that includes an opposite facing proximity sensor and an ambient light sensor.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include a sensor integrated circuit (IC) employing an opposite facing ambient light sensor and a proximity sensor. Related electronic devices and fabrication methods are also disclosed. The sensor IC may be included in a reality computing electronic device as an example, such as a user mobile and/or wearable reality computing device. The ambient light sensor receives ambient light in an ambient field of view of the ambient light sensor in the environment of the sensor IC. As an example, an electronic device that includes the sensor IC may adjust the brightness of its display(s) based on the amount of detected ambient light by the ambient light sensor. The proximity sensor is configured to emit light at a field angle in an emission field from the sensor IC and also detect returned emitted light that is reflected or scattered from another object, such as a user, in its proximity field of view. As another example, an electronic device that includes the sensor IC can adjust its operating mode based on detecting the amount of returned emitted light as an indication of a detected user of the electronic device. It may be important for a proximity sensor and ambient light sensor to be facing outward in different and/or opposite directions from each other due to an electronic device's inherent configuration, whereby a user of the electronic device would be detected from one side of the electronic device opposite of a side where the user would perceive ambient light. Thus, in exemplary aspects, a sensor IC is provided that includes a proximity sensor and an ambient light sensor disposed adjacent to different (e.g., opposing) respective sides of the sensor IC. The proximity sensor and the ambient light sensor can be disposed in the sensor IC to face outward in opposite directions from each other in a single package. As an example, this arrangement can also make a wearable electronic device that incorporates the sensor IC more ergonomically feasible for integration in wearable devices, because the orientation of the proximity sensor and ambient light sensor in the sensor IC on different (e.g., opposing) sides can automatically align towards the user and the user's experience of ambient light as the wearable electronic device is designed to be worn. Further, by the proximity sensor and the ambient light sensor being disposed as integrated components in a single sensor IC facing in different directions, the extra cost and/or area of having to provide such sensors in multiple packages to enable such sensors being disposed in an electronic device to face outward in different directions may be avoided.

Also, in other exemplary aspects, by the proximity sensor and ambient light sensor being disposed adjacent to different (e.g., opposing) respective sides of the sensor IC, the ambient field of view of the ambient light sensor and the emission field of the proximity sensor can be non-overlapping. This is so that light emitted by the proximity sensor is either not received, or is received in a reduced intensity, by the ambient light sensor as an erroneous indication of ambient light. This can improve the accuracy of ambient light detection by the ambient light sensor, which in turn can allow for an electronic device that incorporates the sensor IC to adjust the brightness of a display(s) based on an accurate detection of ambient light.

Figure 2B:
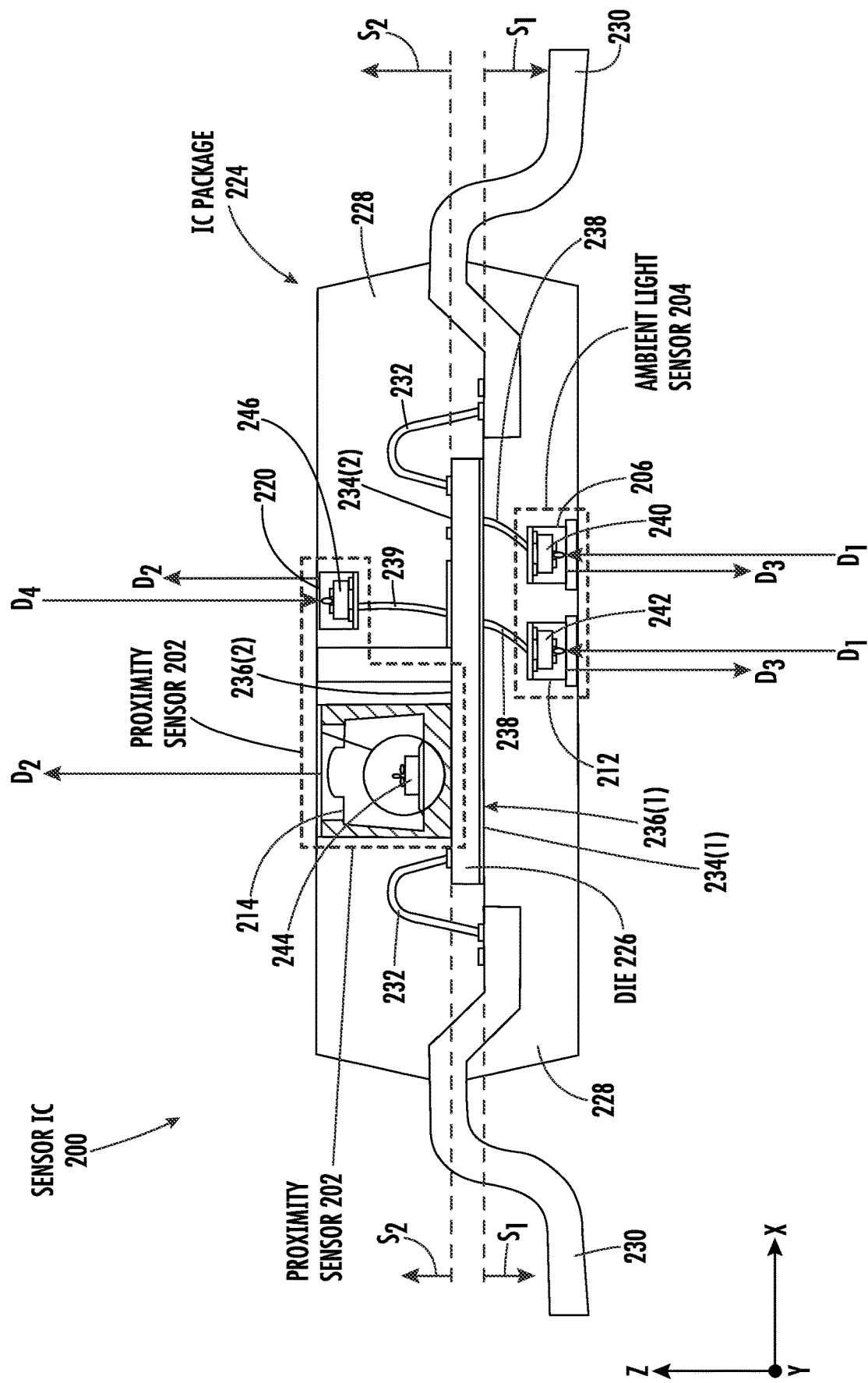

In this regard, FIGS. 2A and 2B are side views of an exemplary sensor IC 200 that includes a proximity sensor 202 and an ambient light sensor 204. As discussed in more detail below, the proximity sensor 202 is disposed in the sensor IC 200 to be opposite facing of the ambient light sensor 204. In this example, the proximity sensor 202 is disposed in the sensor IC 200 to be opposite facing of the ambient light sensor 204 in the vertical direction (Z-axis direction), but such is not limiting. The sensor IC 200 may be included in a computing electronic device as an example, such as a user mobile and/or wearable reality computing device, to detect the proximity of a user of such electronic device and to detect ambient light around the electronic device.

With reference to FIG. 2A, the ambient light sensor 204 in the sensor IC 200 in FIG. 2 includes a visible light receiver 206 that is configured to detect visible light in ambient, visible light 208 in the environment of the sensor IC 200 from a first direction $D_1$ (vertical Z-axis direction) in an ambient field of view 210 having a first center axis $A_1$ in the environment of the sensor IC 200. The first center axis $A_1$ extends in the vertical direction (Z-axis direction) orthogonal to the horizontal directions (X- and Y-axis directions). As an example, an electronic device that includes the sensor IC 200 may adjust the brightness of its display(s) based on the amount of detected ambient, visible light 208 by the visible light receiver 206.

Even though the visible light receiver 206 of the ambient light sensor 204 is configured to receive and detect visible light, the visible light receiver 206 may also detect some IR light. It may be desired to compensate for this detected IR light in the detected ambient, visible light 208 so received IR light by the ambient light sensor 204 is not used or its influence is reduced as an indication the amount of visible light observed by a user of the electronic device. In this regard, the ambient light sensor 204 in the sensor IC 200 in FIG. 2 in this example also includes an optional second light receiver 212 that in this example is an IR light receiver. The second light receiver 212 is configured to receive and detect ambient, IR light 208R in the ambient, visible light 208. Thus, in an example, an electronic device that includes the sensor IC 200 can interface with the second light receiver 212 to receive an indication of the amount of IR light detected in the ambient, visible light 208 to compensate (e.g., subtract such from) the amount of detected ambient, visible light 208 by visible light receiver 206. This provides a more accurate representation of the amount of visible light detected in the ambient, visible light 208.

With continuing reference to FIG. 2A, the proximity sensor 202 in the sensor IC 200 in this example includes a light emitter 214 that is configured to emit a first light 216 in a second direction $D_2$ (vertical Z-axis direction) in an emission field 218 having a second center axis $A_2$. The second center axis $A_2$ extends in the vertical direction (Z-axis direction) orthogonal to the horizontal directions (X- and Y-axis directions). For example, the light emitter 214 may be light emitting device (LED). The light emitter 214 may be an infrared (IR) light emitter (e.g., IR LED) that is configured to emit IR light as the first light 216. The proximity sensor 202 also includes a proximity light receiver 220 that is configured to detect at least a portion of the first light 216 reflected and/or scattered from an object as returned light 216R in a proximity field of view 222 to the proximity light receiver 220. For example, the proximity light receiver 220 may be a photodetector, and more specifically an IR photodetector that is configured to detect IR light. As an example, an electronic device that includes the sensor IC 200 can use information regarding the amount of returned light 216R as an indication of a detected user of the electronic device to then adjust its operating mode accordingly. For example, it may be desired to place the electronic device in an active or ready mode when an object is detected using the proximity sensor 202 as an indication of a user using the electronic device.

To allow for the proximity sensor 202 and the ambient light sensor 204 to be provided as part of the same sensor IC 200, yet be able to be employed in an electronic device to detect the proximity of a user and ambient light from opposite sides of the sensor IC 200, the proximity sensor 202 and the ambient light sensor 204 are disposed adjacent to different (e.g., opposing) sides $S_1$, $S_2$ of the sensor IC 200. This is shown in the side view of the sensor IC 200 in FIG. 2B. As shown in FIG. 2B, the sensor IC 200 is provided in the form of an IC package 224. The IC package 224 includes a first die 226, the ambient light sensor 204 and the proximity sensor 202 encapsulated in an overmold material 228 to form the IC package 224. The first die 226 include circuits that are configured to interface with the ambient light sensor 204 and proximity sensor 202 to detect ambient light and objects in proximity of the sensor IC 200, such as for reasons previously discussed above. The first die 226 is coupled to pins 230 of the IC package 224 through wire bonds 232. The first die 226 that has a first surface 234(1) on a first side 236(1) and a second surface 234(2) on a second side 236(2) opposite the first side 236(1) in the vertical direction (Z-axis direction). The first side 236(1) of the first die 226 is on the first side $S_1$ of the sensor IC 200 and IC package 224. The second side 236(2) of the first die 226 is on the second side $S_2$ of the sensor IC 200 and IC package 224.

With continuing reference to FIG. 2B, the first die 226 is also coupled to the first and second light receivers 206, 212 of the ambient light sensor 204 through wire bonds 238. The first and second light receivers 206, 212 of the ambient light sensor 204 are adjacent to the first surface 234(1) of the first die 226 on a first side 236(1) of the first die 226 on the first side $S_1$ of the IC package 224. The first and second light receivers 206, 212 of the ambient light sensor 204 are oriented such that their detector components 240, 242 face outward from the first side $S_1$ of the IC package 224 in a third direction $D_3$ in a vertical direction (Z-axis direction). The detector components 240, 242 are components that receive light and are sensitive to the electromagnetic radiation of received light, such as through a photoelectric or photochemical effect. Thus, the first and second light receivers 206, 212 of the ambient light sensor 204 are configured to receive ambient, visible light 208 (shown in FIG. 2A) that is emitted in the first direction $D_1$ (which is also towards the second direction $D_2$) towards the first side 236(1) of the first die 226 on the first side $S_1$ of the IC package 224.

Also, as shown in FIG. 2B, the light emitter 214 and the proximity light receiver 220 of the proximity sensor 202 are adjacent to the second surface 234(2) of the first die 226 on the second side 236(2) of the first die 226 on the second side $S_2$ of the IC package 224. The light emitter 214 is directly coupled to the second surface 234(2) of the first die 226 and electrically connected to the first die 226. The proximity light receiver 220 is electrically coupled to the first die 226 through a wire bond(s) 239. The light emitter 214 and the proximity light receiver 220 of the proximity sensor 202 are oriented such their respective emitter component 244 and detector component 246 face outward from the second side $S_2$ of the IC package 224 in the second direction $D_2$ in a vertical direction (Z-axis direction), opposite of the third direction $D_3$ in which the ambient light sensor 204 faces. The emitter component 244 is the component of the light emitter 214 that emits light. The detector component 246 of the proximity light receiver 220 is the component that receives light and is sensitive to electromagnetic radiation of received light, such as through a photoelectric or photochemical effect. Thus, the light emitter 214 of the proximity sensor 202 is configured to emit first light 216 (see FIG. 2A) outward from the second side 236(2) of the first die 226 on the second side $S_2$ of the IC package 224 in the second direction $D_2$. The proximity light receiver 220 of the proximity sensor 202 is configured to receive and detect light that is emitted (including light 216 emitted from the light emitter 214 shown in FIG. 2A) in the fourth direction $D_4$ (which is also towards the first direction $D_1$) towards the second side 236(2) of the first die 226 on the second side $S_2$ of the IC package 224.

In this manner, the arrangement of the sensor IC 200 allows the sensor IC 200 to be integrated into an electronic device in a more ergonomically feasible manner, because the orientation of the proximity sensor and ambient light sensor in the sensor IC on different (e.g., opposing) sides can automatically align towards the user and the user's experience of ambient light as the wearable electronic device is designed to be worn. Further, by the proximity sensor 202 and the ambient light sensor 204 being disposed as integrated components in a single sensor IC 200 facing in different directions, the extra cost and/or area of having to provide such proximity sensor 202 and ambient light sensor 204 in multiple packages to enable such sensors being disposed in an electronic device to face outward in different directions may be avoided.

Also, as shown in FIG. 2A, the ambient field of view 210 of the ambient light sensor 204 and the emission field 218 of the proximity sensor 202 can be non-overlapping so that light 216 emitted by the proximity sensor 202 is either not received, or is received in a reduced intensity, by the ambient light sensor 204 as an erroneous indication of ambient light. This can improve the accuracy of ambient light detection by the ambient light sensor 204, which in turn can allow for an electronic device that incorporates the sensor IC 200 to adjust the brightness of a display(s) based on an accurate detection of ambient, visible light 208. This arrangement can also make a wearable electronic device that incorporates the sensor IC 200 more ergonomically feasible for integration in wearable devices, because the orientation of the proximity sensor 202 and ambient light sensor 204 in the sensor IC 200 on different (e.g., opposing) sides $S_1$, $S_2$ of the IC package 224 can automatically align towards the user and the user's experience of ambient, visible light 208 as the wearable electronic device is designed to be worn.

Thus, the sensor IC 200 in FIGS. 2A and 2B is different than a sensor IC that incorporates a proximity sensor and ambient light sensor on the same side of the sensor IC that both emit and receive light on the same side of the sensor IC, such as sensor IC shown in the sensor IC 300 in FIG. 3. As shown in FIG. 3, the sensor IC 300 includes a proximity sensor 302 and an ambient light sensor 304 that are both disposed adjacent to the same, second side 306(2) of a die 308. The second side 306(2) of the die 308 is on a second side $S_4$ of the sensor IC 300. The first side 306(1) of the die 308 is on a first side $S_3$ of the sensor IC 300. This arrangement of the sensor IC 300 in FIG. 3 may not allow the sensor IC 300 to be viably incorporated into a wearable electronic device, because the orientation of the proximity sensor 302 and ambient light sensor 304 in the sensor IC 300 are outward from the same side $S_4$ of the sensor IC 300. Thus, either the proximity sensor 302 or the ambient light sensor 304, being part of the same sensor IC 300 and its package, will not align towards a user for detecting their proximity to an electronic device including the sensor IC 300 as well as align towards the direction of ambient light perceived by the user of the electronic device. Also, in the sensor IC 300 in FIG. 3, the ambient light sensor 304 may receive light emitted by the proximity sensor 302, which could result in an inaccurate ambient light detection.

Figure 4:
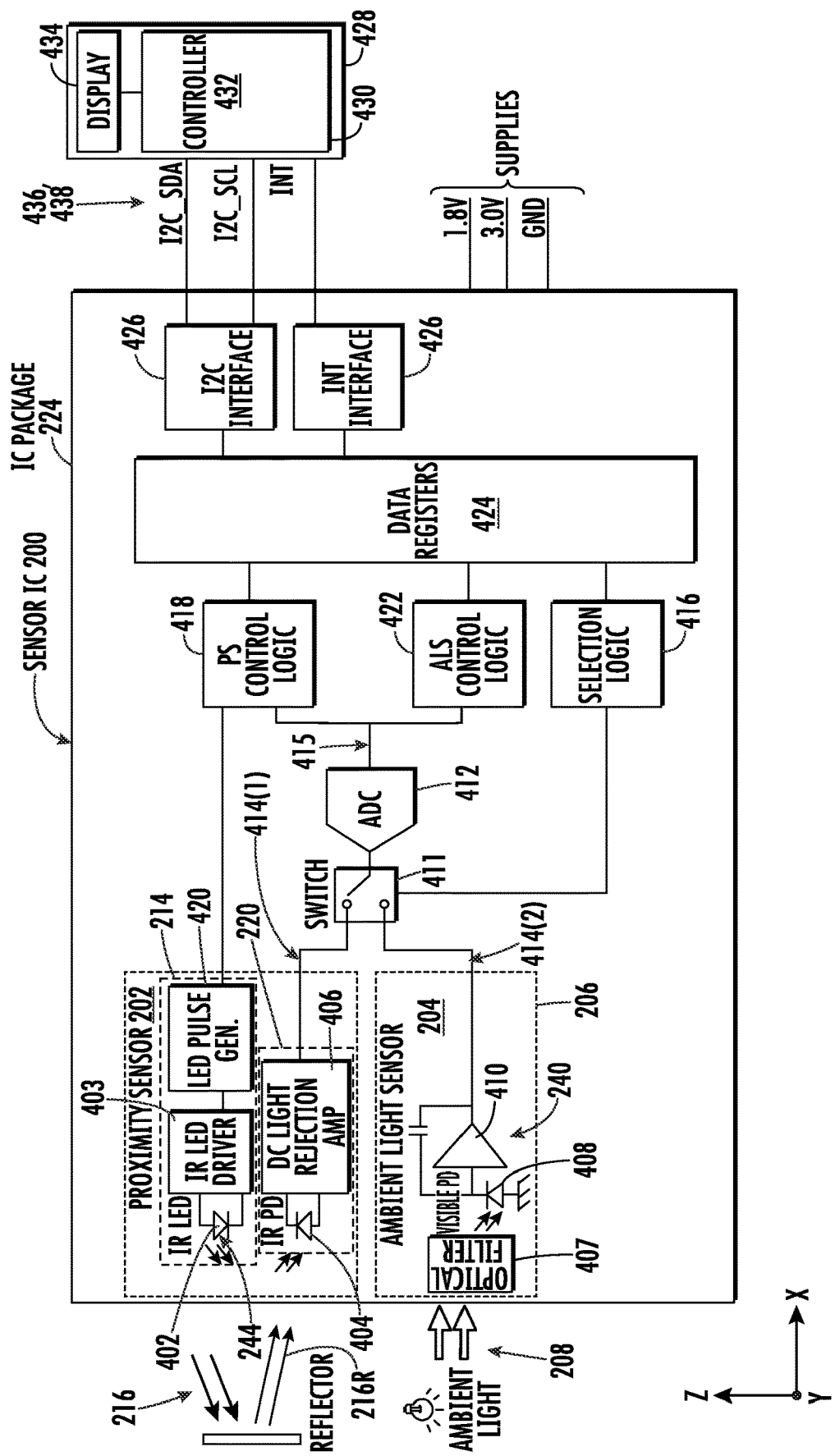
FIG. 4 is a block diagram of a sensor IC in FIGS. 2A and 2B that includes a proximity sensor configured to detect the proximity of an object and an ambient light sensor configured to detect ambient light.

FIG. 4 is a block diagram of the sensor IC 200 in FIGS. 2A and 2B that illustrates an exemplary architecture of components in the sensor IC 200 including the proximity sensor 202 and ambient light sensor 204. As shown in FIG. 4, the proximity sensor 202 includes the light emitter 214 which include the emitter component 244 in the form of an IR LED 402 in this example. The IR LED 402 is oriented to emit light outwards from the sensor IC 200 as shown in FIG. 2A and described above. The proximity sensor 202 includes an IR LED driver circuit 403 that is configured to drive a current to the IR LED 402 to cause the IR LED 402 to emit IR light as the first light 216 (also referred to herein as "IR light 216"). If an object is in the path of the IR light 216 and reflects or scatters at least a portion of the light emitter 214 as returned light 216R, the proximity sensor 202 also includes the proximity light receiver 220 that includes the detector component 246 in the form of an IR photodetector 404. The IR photodetector 404 is configured to receive and detect IR light, including returned light 216R. The proximity light receiver 220 also includes a light rejection amplifier 406 that is configured to amplify a signal received from the IR photodetector 404 generated as a result of IR photodetector 404 absorbing IR light.

With continuing reference to FIG. 4, the sensor IC 200 also includes the ambient light sensor 204 that includes the visible light receiver 206. In this example, the detector component 240 includes an optical filter 407 that is configured to receive and filter the ambient, visible light 208 and direct the filtered ambient, visible light 208 to the detector component 240 in the form of a visible light photodetector 408. The visible light photodetector 408 is coupled to an amplifier 410 (e.g., an operational amplifier) to amplify a signal generated by visible light photodetector 408 in response to receiving the ambient, visible light 208. In this example, to share a front-end circuitry between the proximity sensor 202 and the ambient light sensor 204, the sensor IC 200 includes a shared analog switch 411. The analog switch 411 can be switched to couple either the proximity sensor 202 or the ambient light sensor 204 to an analog-to-digital (ADC) controller 412 circuit, which converts a proximity signal 414(1) and ambient light signal 414(2) generated by the respective proximity light receiver 220 and visible light receiver 206 to a digital signal 415 representing detected light 216R, 208. The sensor IC 200 includes a selection logic circuit 416 that is controlled through data registers 424 to switch the analog switch 411.

The sensor IC 200 also includes respective proximity sensor control logic circuitry 418 that is configured to activate and deactivate a LED plus generator 420 in the light emitter 214 in the proximity sensor 202 to cause the IR LED driver circuit 403 to cause the IR LED 402 to emit IR light 216. The proximity sensor control logic circuitry 418 is also configured to receive the digital signal 415 indicative of the amount of returned light 216R detected by the proximity light receiver 220. The sensor IC 200 also includes an ambient light control logic circuitry 422 that is configured to receive the digital signal 415 indicative of the amount of ambient, visible light 208 detected by the visible light receiver 206 of the ambient light sensor 204. The ambient light control logic circuitry 422 and the proximity sensor control logic circuitry 418 is interfaced to data registers 424 that can be written by a controller, such as a micro-controller or microprocessor through interface circuits 426. The data registers 424 are mapped to specific registers assigned to the proximity sensor 202 and the ambient light sensor 204 such that writing data to these specific registers allows an external device to control the operation of the proximity sensor 202 and the ambient light sensor 204. The ambient light control logic circuitry 422 and the proximity sensor control logic circuitry 418 also writes data received via the digital signal 415 regarding detected, returned light 216R and detected ambient, visible light 208 from the proximity sensor 202 and ambient light sensor 204 to determine if an object is detected in proximity as well as the ambient light conditions of the sensor IC 400.

With continuing reference to FIG. 4, an electronic device 428 as part of a computing device 430 can interface with the sensor IC 200 through the interface circuits 426 of the sensor IC 200. The electronic device 428 can include a controller 432 (e.g., a microcontroller, microprocessor) that interfaces with the interface circuits 426 of the sensor IC 200 to use proximity and ambient light data from the sensor IC 200 to control certain features of the electronic device 428. For example, the computing device 430 can include a display 434 that is under control of the controller 432. The controller 432 is configured to retrieve or receive ambient light information 436 through the interface circuits 426 from the sensor IC 200 indicative of the amount of ambient, visible light 208 detected by the ambient light sensor 204. The controller 432 is also configured to retrieve or receive proximity information 438 through the interface circuits 426 from the sensor IC 200 indicative of the proximity of an object detected by the proximity sensor 202. The controller 432 may be configured to brightness of the display 434 based on the ambient light information 436. For example, the controller 432 may reduce the brightness of the display 434 as a function of an increase in the amount of ambient, visible light 208 detected. The controller 432 may also be configured to control an operational mode of the electronic device 428 based on the proximity information 438. For example, the controller 432 may cause the electronic device 428 to enter into an idle or sleep mode with reduced functionality to reduce power consumption when an object (e.g., a user) is not detected based on the proximity information 438. The controller 432 may cause the electronic device 428 to enter into an active or awake mode with increased functionality that causes more power to be consumed when an object (e.g., a user) is detected based on the proximity information 438.

Figure 5:
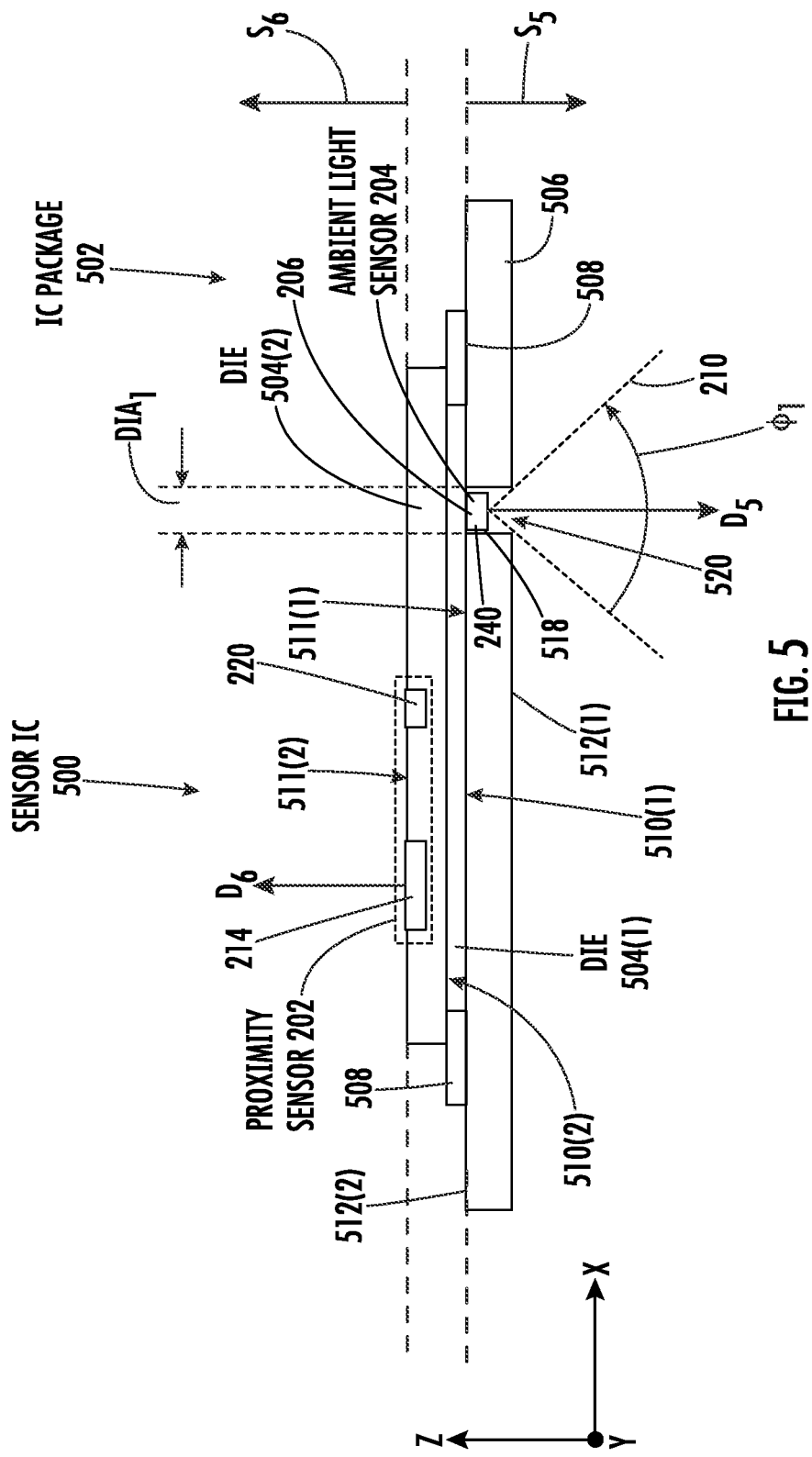
FIG. 5 is a side view of another exemplary sensor IC that includes first and second dies stacked on top of each other adjacent and coupled to a circuit board, wherein the sensor IC includes an ambient light sensor facing outward from a first side of the sensor IC and a proximity sensor facing outward from a second side of the sensor IC opposite of the first side of the sensor IC.

A sensor IC that has a proximity sensor oriented to be opposite facing of an ambient light sensor to reduce or avoid the ambient light sensor receiving light emitted from the proximity sensor can be provided in other package configurations beyond the IC package 224 of the sensor IC 200 in FIG. 200. In this regard, FIG. 5 is a side view of another exemplary sensor IC 500 that includes an IC package 502 that includes a first, bottom die 504(1) and a second, top die 504(2) adjacent to each other and stacked on top of each other in a vertical direction (Z-axis direction) in this example. The first die 504(1) is coupled to a circuit board 506 as part of the IC package 502. Note that the circuit board 506 could be a printed circuit (PCB) or a package substrate as examples. Pins 508 physically and electrically couple the first and second dies 504(1), 504(2) to the circuit board 506. An ambient light sensor 204 like the ambient light sensor 204 in the sensor IC 200 in FIGS. 2A and 2B is disposed adjacent to and is coupled to the first die 504(1) on a first side 510(1) of the first die 504(1). The first die 504(1) also has a second side 510(2) adjacent to a first side 511(1) of the second die 504(2).

The ambient light sensor 204 in the sensor IC 500 in FIG. 5 only has the visible light receiver 206. The previous discussion regarding the ambient light sensor 204 and its emission of light in the sensor IC 200 in FIGS. 2A and 2B can apply to the ambient light sensor 204 in the sensor IC 500 in FIG. 5. The ambient light sensor 204 is oriented outward in a fifth direction $D_5$ from a first side $S_5$ of the IC package 502 in a vertical direction (Z-axis direction). The proximity sensor 202 is disposed adjacent to and is coupled to a second side 511(2) of the second die 504(2) and oriented outward from a second side $S_6$ of the IC package 502 in a sixth direction $D_6$ in a vertical direction (Z-axis direction), opposite of the fifth direction $D_5$. The proximity sensor 202 in the sensor IC 500 in FIG. 5 can be like the proximity sensor 202 in the sensor IC 200 in FIGS. 2A and 2B. Thus, in this orientation, the proximity sensor 202 is oriented to be opposite facing of the ambient light sensor 204 to reduce or avoid the ambient light sensor receiving light emitted from the proximity sensor 202 as provided in the sensor IC 200 in FIGS. 2A and 2B.

With continuing reference to FIG. 5, the circuit board 506 has a first surface 512(1) and a second surface 512(2) opposite the first surface 512(1) in the vertical direction (Z-axis direction). The first die 504(1) is adjacent to and coupled to the second surface 512(2) surface of the circuit board 506. To prevent the circuit board 506 from obstructing the ambient field of view 210 of the ambient light sensor 204, the circuit board 506 also includes a light pipe 518. The light pipe 518 is an opening 520 in the circuit board 506 that extends from the first surface 512(1) to the second surface 512(2) in this example. The first die 504(1) is coupled to the ambient light sensor 204 and is placed on the circuit board 506 such that the ambient light sensor 204 is disposed adjacent to the opening 520. In this manner, the detector component 240 of the ambient light sensor 204 is provided with a field of view 210 to receive ambient light through the opening 520 in the circuit board 506. The openings 520 in the circuit board 506 have a first diameter $DIA_1$ that controls the angle $\Phi 1$ of the ambient field of view 210 for receiving ambient light emitted in the sixth direction $D_6$ towards the second surface 512(1) of the circuit board 506 and the first side 510(1) of the first die 504(1).

Figure 6:
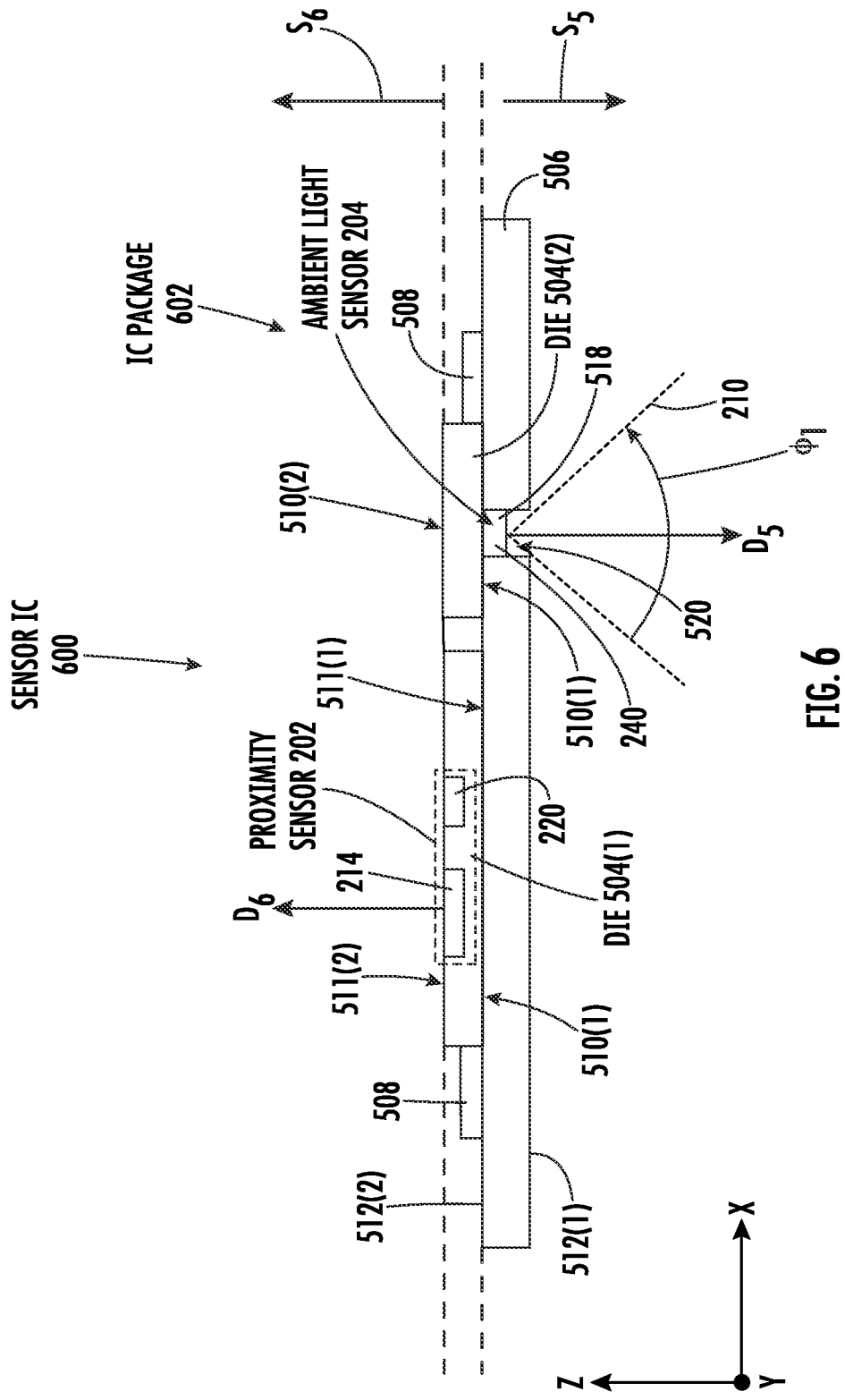
FIG. 6 is a side view of another sensor IC that includes a first and second die disposed side-by-side adjacent to each other on a circuit board, wherein the sensor IC includes an ambient light sensor facing outward from a first side of the sensor IC and a proximity sensor facing outward from a second side of the sensor IC opposite of the first side.

FIG. 6 is a side view of another sensor IC 600 that is similar to the sensor IC 500 in FIG. 5, except that the sensor IC 600 in FIG. 6 has the first and second dies 504(1), 504(2) disposed side-by-side, adjacent to each other on the circuit board 506. Common elements between the sensor IC 500 in FIG. 5 and the sensor IC 600 in FIG. 6 are shown with common element numbers and are not re-described. The first die 504(1) is disposed adjacent to and on the second surface 512(1) of the circuit board 506. The second die 504(2) is also disposed on the second surface 512(1) of the circuit board 506. The second die 504(2) is adjacent to the first die 504(1) in a horizontal direction (X-axis and Y-axis directions). The ambient light sensor 204 is disposed adjacent to and is coupled to the first die 504(1) on a first side 510(1) of the first die 504(1). The ambient light sensor 204 is oriented outward in the fifth direction $D_5$ from a first side $S_5$ of the IC package 602 in a vertical direction (Z-axis direction). The proximity sensor 202 is disposed adjacent to and is coupled to the second side 511(2) of the second die 504(2) and oriented outward from a second side $S_6$ of the IC package 502 in the sixth direction $D_6$ in a vertical direction (Z-axis direction), opposite of the fifth direction $D_5$. Thus, in this orientation of the sensor IC 600, the proximity sensor 202 is oriented to be opposite facing of the ambient light sensor 204 to reduce or avoid the ambient light sensor 204 receiving light emitted from the proximity sensor 202, as provided in the sensor IC 200 in FIGS. 2A and 2B.

Like the sensor IC 500 in FIG. 5, in the sensor IC 600 in FIG. 6, to prevent the circuit board 506 from obstructing the ambient field of view 210 of the ambient light sensor 204, the circuit board 506 also includes the light pipe 518. The light pipe 518 is in the opening 520 in the circuit board 506 that extends from the first surface 512(1) to the second surface 512(2) in this example. The first die 504(1) and its coupled ambient light sensor 204 are placed on the circuit board 506 such that the ambient light sensor 204 is disposed adjacent to the opening 520. In this manner, the detector component 240 of the ambient light sensor 204 is provided with the ambient field of view 210 to receive ambient light through the opening 520 in the circuit board 506.

Figure 7:
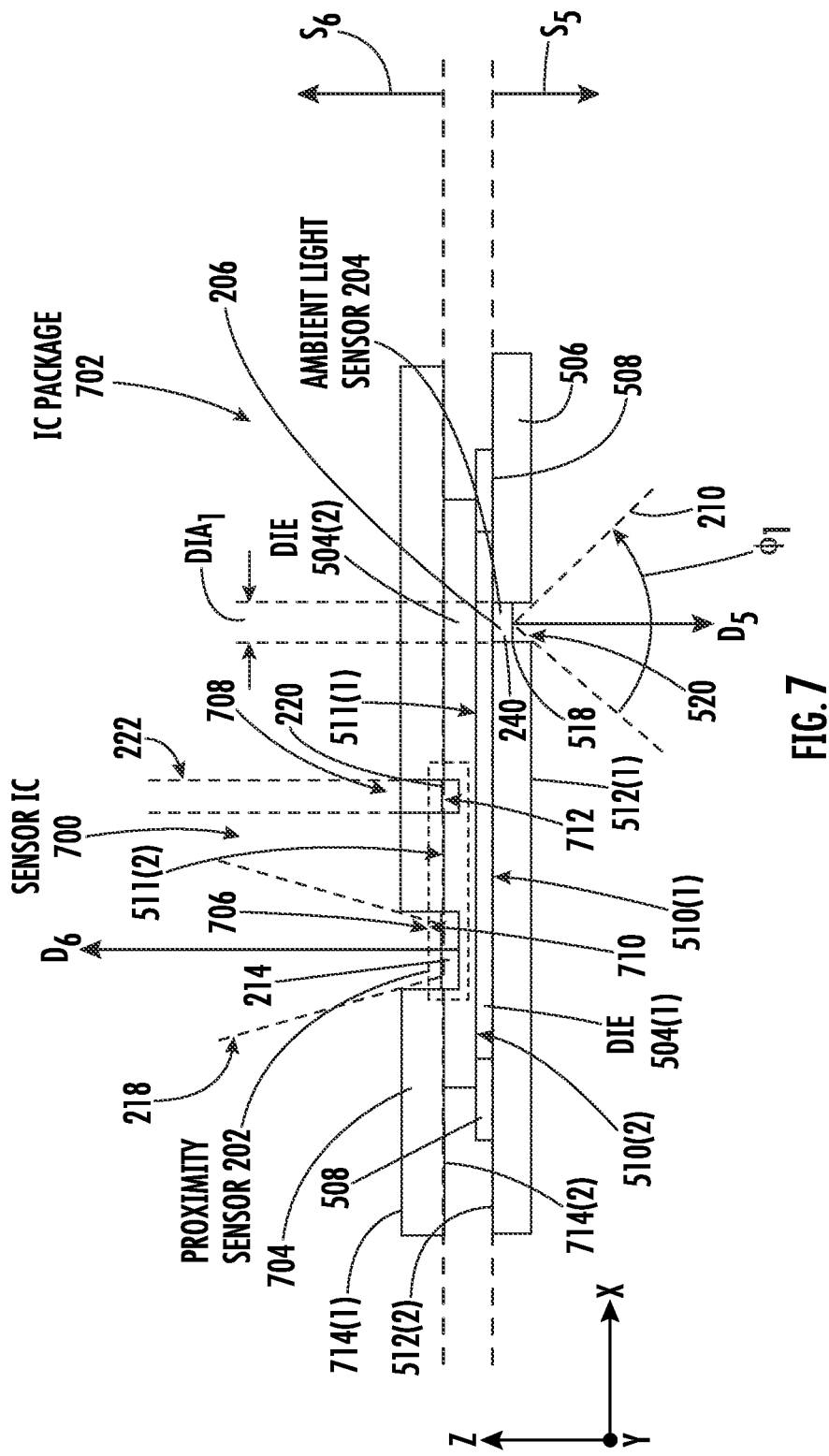
FIG. 7 is a side view of another exemplary sensor IC similar to the sensor IC in FIG. 6, with the first and second dies disposed between outer circuit boards.

FIG. 7 is a side view of another exemplary sensor IC 700 that is provided as an IC package 702 and that is similar to the sensor IC 500 in FIG. 5. However, in the sensor IC 700 in FIG. 7, a second circuit board 704 is provided in the IC package 702 with the first and second dies 504(1), 504(2) disposed between first and second circuit boards 506, 704. Common elements between the sensor IC 500 in FIG. 5 and the sensor IC 700 in FIG. 7 are shown with common element numbers and are not re-described. Because the second circuit board 704 is disposed adjacent to the second side 511(2) of the second die 504(1), the second circuit board 704 would obstruct the emission field 218 and the proximity field of view 222 of the respective light emitter 214 and proximity light receiver 220 of the proximity sensor 202. However, like the light pipe 518 provided in the first circuit board 506 for the ambient light sensor 204, the second circuit board 704 also includes a second light pipe 706 and a third light pipe 708 in the form of respective second and third openings 710, 712. The light pipes 706, 708 are provided so that the emission field 218 and the proximity field of view 222 of the respective light emitter 214 and proximity light receiver 220 of the proximity sensor 202 are not obstructed by the second circuit board 704.

In this regard, as shown in FIG. 7, the second opening 710 in the second circuit board 704 that extends from a first surface 714(1) of the second circuit board 704 to a second surface 714(2) of the second circuit board 704 in this example. The third opening 712 in the second circuit board 704 also extends from the first surface 714(1) of the second circuit board 704 to the second surface 714(2) of the second circuit board 704. The second die 504(2) and its coupled proximity sensor 202 are placed on the second circuit board 704 such that the light emitter 214 and the proximity light receiver 220 of the proximity sensor 202 is disposed adjacent to the respective second and third openings 710, 712. In this manner, light emitter 214 of the proximity sensor 202 is provided with the emission field 218 to emit light through the second opening 710 in the second circuit board 704. Also, the proximity light receiver 220 of the proximity sensor 202 is provided with the proximity field of view 222 to receive light through the third opening 712 in the second circuit board 704.

Figure 8:
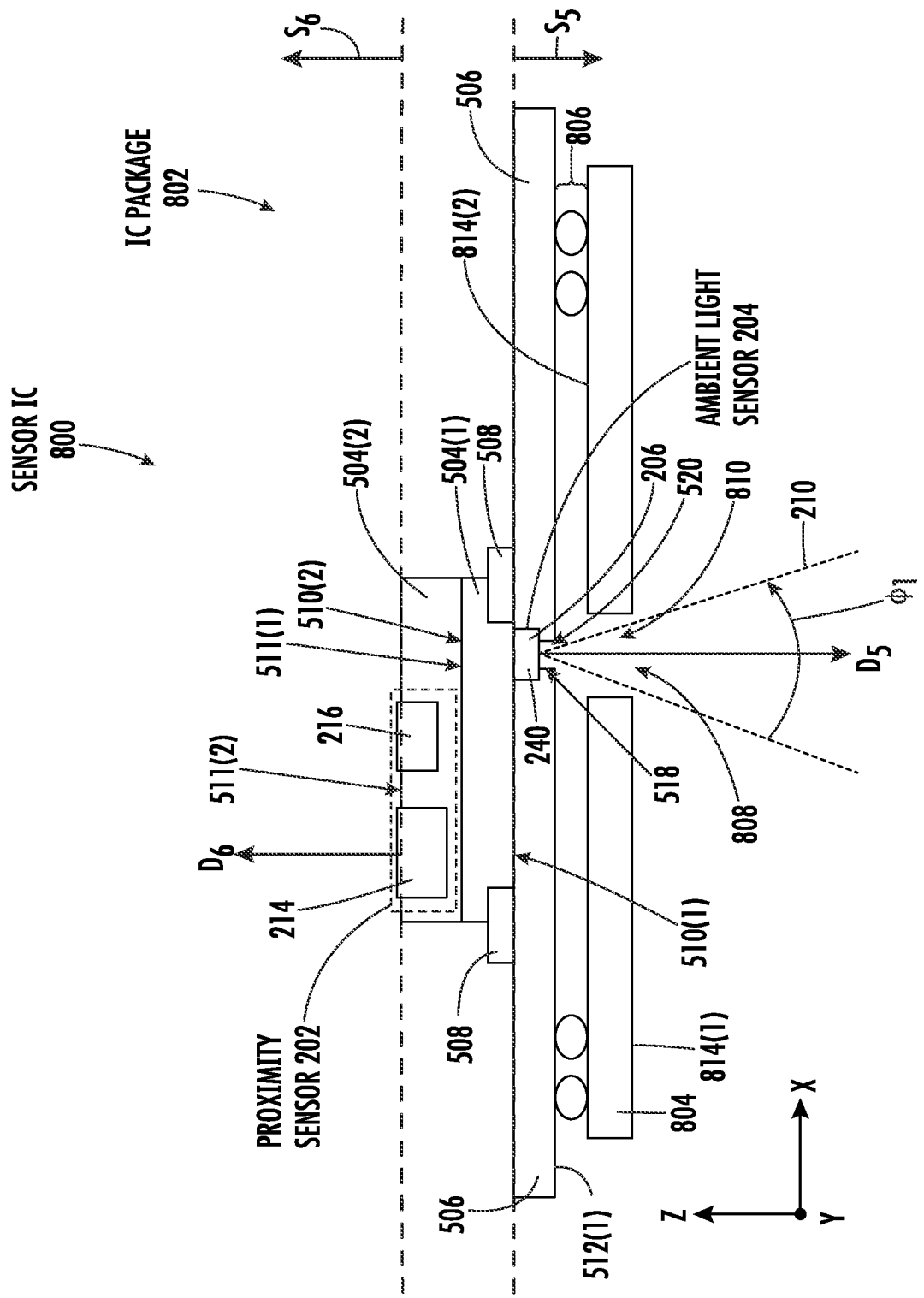
FIG. 8 is a side view of another exemplary sensor IC similar to the sensor IC in FIG. 4, but with a second, bottom circuit board disposed adjacent to the ambient light sensor and containing a light pipe to allow the ambient field of view of the ambient light sensor to extend beyond the second circuit board.

FIG. 8 is a side view of another exemplary sensor IC 800 that is provided as an IC package 802 and that is similar to the sensor IC 500 in FIG. 5. However, in the sensor IC 800 in FIG. 8, a second circuit board 804 is provided in the IC package 802 that is disposed below the first surface 512(1) of the circuit board 506. The second circuit board 804 is coupled to the circuit board 506 through external connectors 806, which may be solder bumps or ball grid array (BGA) interconnects as examples. Common elements between the sensor IC 500 in FIG. 5 and the sensor IC 800 in FIG. 8 are shown with common element numbers and are not re-described. Because the second circuit board 804 is disposed adjacent to the first surface 512(1) of the circuit board 506, the second circuit board 804 would obstruct the ambient field of view 210 of the visible light receiver 206 of the ambient light sensor 204. However, like the light pipe 518 provided in the first circuit board 506 for the ambient light sensor 204, the second circuit board 804 also includes a second light pipe 808 in the form a second opening 810. The second light pipe 808 is provided so that the ambient field of view 210 of the visible light receiver 206 of the ambient light sensor 204 is also not obstructed by the second circuit board 804.

In this regard, as shown in FIG. 8, the second opening 810 in the second circuit board 804 that extends from a first surface 814(1) of the second circuit board 804 to a second surface 814(2) of the second circuit board 804 in this example. The second circuit board 804 is aligned with respect to the first circuit board 506 so that the opening 520 in the first circuit board 506 and the second opening 810 in the second circuit board 804 are at least partially overlapping in the vertical direction (Z-axis direction). In this manner, visible light receiver 206 of the ambient light sensor 204 is provided with the ambient field of view 210 to receive light through the second opening 810 in the second circuit board 804 and the opening 520 in the first circuit board 506.

Figures 9A, 9B:
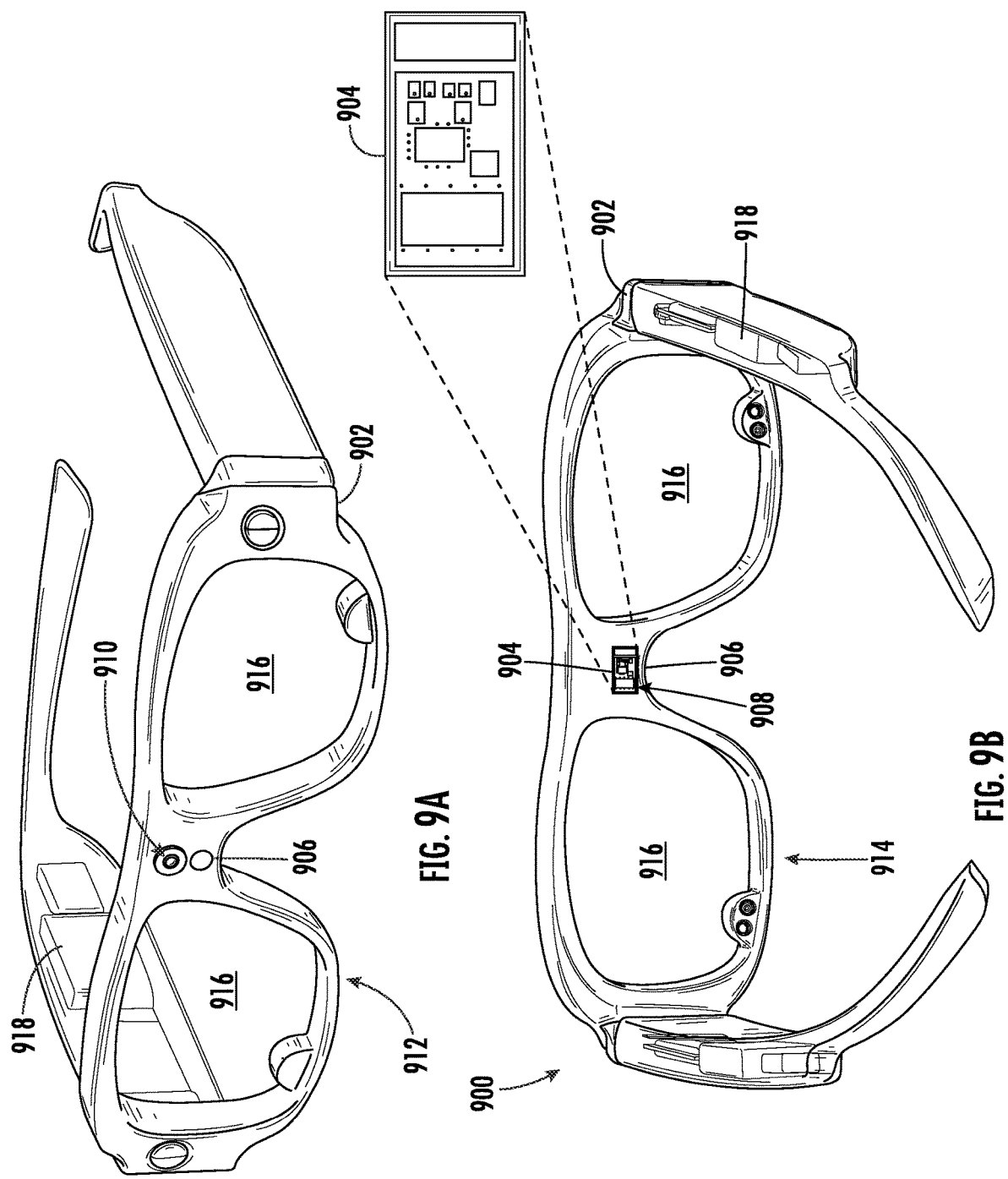
FIGS. 9A and 9B are front perspective and rear perspective views, respectively, of an electronic device in the form of extended reality (XR) glasses that includes a sensor IC mounted in the nose bridge of the XR glasses, wherein the sensor IC includes an opposite facing proximity sensor and an ambient light sensor, including but not limited to the sensor ICs in FIGS. 2A-2B and 4-8.

The sensor ICs 200, 500, 600, 700, 800 in FIGS. 2A-2B and 4-8 can be incorporated or integrated in an electronic device, including but not limited to user wearable or mobile electronic devices, to detect ambient light and proximity. In this regard, FIGS. 9A and 9B are front perspective and rear perspective views, respectively, of a device 900 in the form of extended reality (XR) glasses 902 designed to be worn by a user and that includes a sensor IC 904 mounted in the nose bridge 906 of the XR glasses 902. The sensor IC 904 can be any of the sensor ICs 200, 500, 600, 700, 800 in FIGS. 2A-2B and 4-8 as examples. The sensor IC 904 includes an opposite facing proximity sensor 908 and an ambient light sensor 910 to reduce or avoid the ambient light sensor 910 receiving light emitted from the proximity sensor 908. As shown in FIG. 9A in the front view of the XR glasses 902, the ambient light sensor 910 is adjacent to, exposed, and facing outward from the front side 912 of the XR glasses 902 so that the ambient light sensor 910 receives ambient light in the same direction as would be perceived by a user wearing the XR glasses 902. As shown in FIG. 9B in the rear view of the XR glasses 902, the proximity sensor 908 is adjacent to, exposed, and facing outward from a rear side 914 of the XR glasses 902 so that the proximity sensor 908 can detect when a user places the XR glasses 902 close to them when about to or wearing the XR glasses 902. The orientation of the proximity sensor 908 and ambient light sensor 910 being disposed on opposite sides of the sensor IC 904 is particularly advantageous in this arrangement of XR glasses 902, because the desired orientation is for the proximity sensor 908 to be exposed and facing outward from the rear side 914 of the XR glasses 902, and for the ambient light sensor 910 to be exposed and facing outward from the front side 912 of the XR glasses 902. Thus, the proximity sensor 908 and ambient light sensor 910 already being disposed on opposite sides of the sensor IC 904 means that the sensor IC 904 can be integrated into the XR glasses 902 without having route or re-route interfaces to the proximity sensor 908 or ambient light sensor 910 if such were not located on opposite sides of the sensor IC 904.

The XR glasses 902 may have an integrated display 916 that can be controlled by an electronic device 918. The electronic device 918 is also interfaced to the sensor IC 904 so that the electronic device 918 retrieves or receives ambient light information from the sensor IC 904 indicative of the amount of ambient light detected by the ambient light sensor 910. The electronic device 918 may be configured to brightness of the display 916 based on the ambient light information. For example, the electronic device 918 may reduce the brightness of the display 916 as a function of an increase in the amount of ambient light detected. The electronic device 918 is also configured to retrieve or receive proximity information from the sensor IC 904 indicative of the proximity of an object detected by the proximity sensor 908. The electronic device 918 may also be configured to control an operational mode of the electronic device 918 based on the proximity information. For example, the electronic device 918 may cause the electronic device 918 to enter into an idle or sleep mode with reduced functionality to reduce power consumption when an object (e.g., a user) is not detected based on the proximity information. The electronic device 918 may cause the electronic device 918 to enter into an active or awake mode with increased functionality that causes more power to be consumed when an object (e.g., a user) is detected based on the proximity information.

Figure 10A:
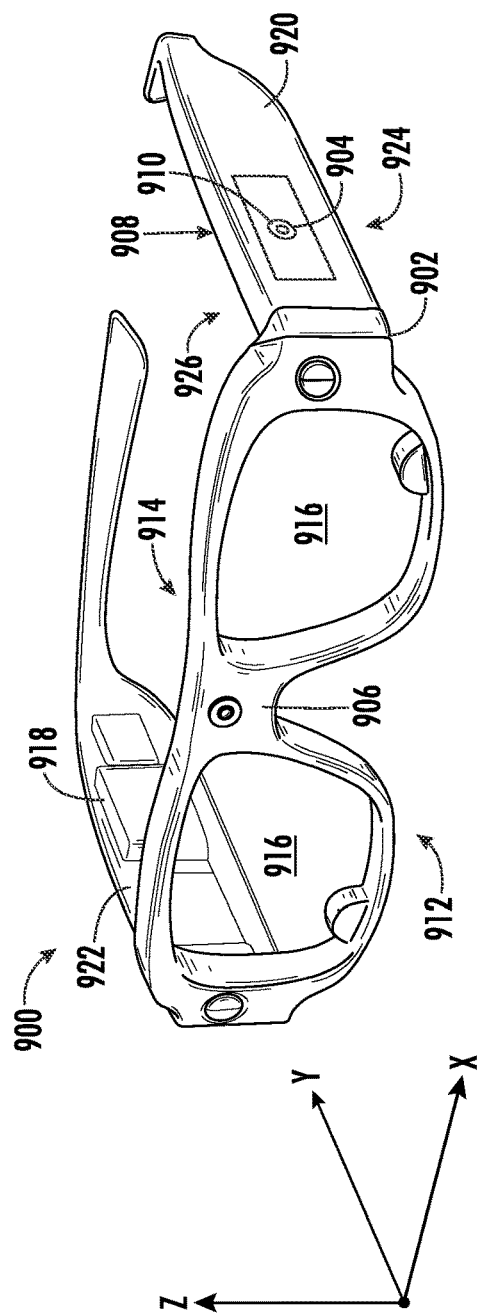
FIGS. 10A and 10B are front perspective and side views, respectively, of the XR glasses in FIGS. 9A and 9B, but with the sensor IC mounted in left and/or right arm of the XR glasses.
Figure 10B:
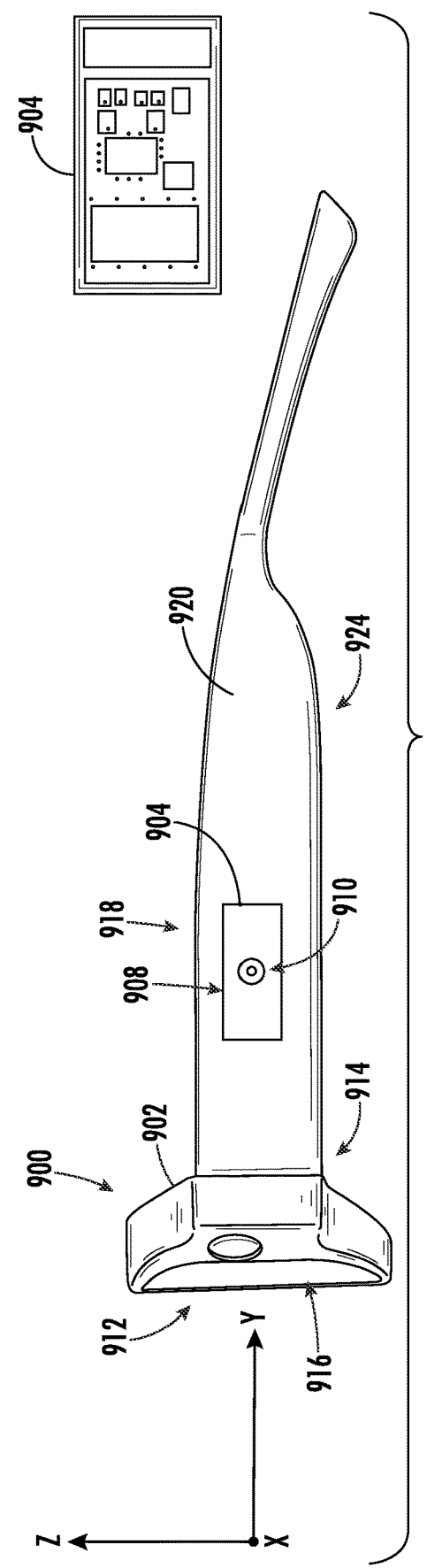

FIGS. 10A and 10B are front perspective and side views, respectively, the XR glasses 902 in FIGS. 9A and 9B, but with the sensor IC 904 mounted in left arm 920 of the XR glasses 902, opposite of the right arm 922. The left and right arms 920, 924 protrude from the front of the XR glasses 902 to facilitate the user to wear the XR glasses 902 on their head. As shown in FIGS. 10A and 10B, in this example, the ambient light sensor 910 is adjacent to, exposed, and facing outward from an outward side 924 of the left arm 922 of the XR glasses 902 so that the ambient light sensor 910 receives ambient light in an outward direction from the XR glasses 902. In this example, the proximity sensor 908 is adjacent to, exposed, and facing outward from the rear side 914 of the left arm 922 so that the proximity sensor 908 can detect when a user places the XR glasses 902 close to them when about to wear or wearing the XR glasses 902. The orientation of the proximity sensor 908 and ambient light sensor 910 being disposed on opposite sides of the sensor IC 904 is particularly advantageous in this arrangement of XR glasses 902, because the desired orientation is for the proximity sensor 908 to be exposed and facing outward from the rear side 914 of the XR glasses 902 and for the ambient light sensor 910 to be exposed and facing outward from the front side 912 of the XR glasses 902.

Figure 11A:
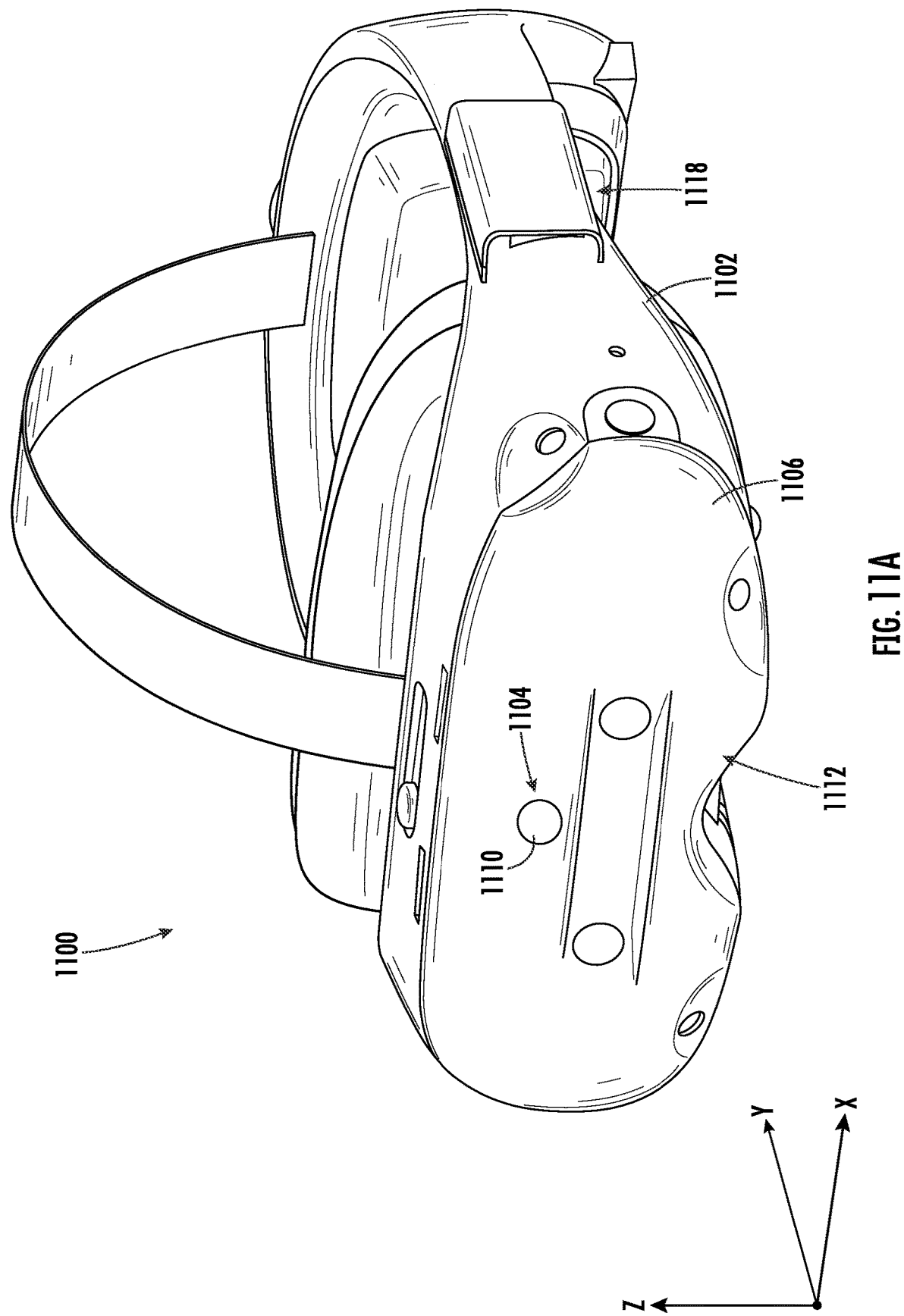
FIGS. 11A and 11B are front and rear perspective views, respectively, of an electronic device in the form of head-mounted virtual reality (VR) display device that includes a sensor IC that includes an opposite facing proximity sensor and an ambient light sensor, including but not limited to the sensor ICs in FIGS. 2A-2B and 4-8.
Figure 11B:
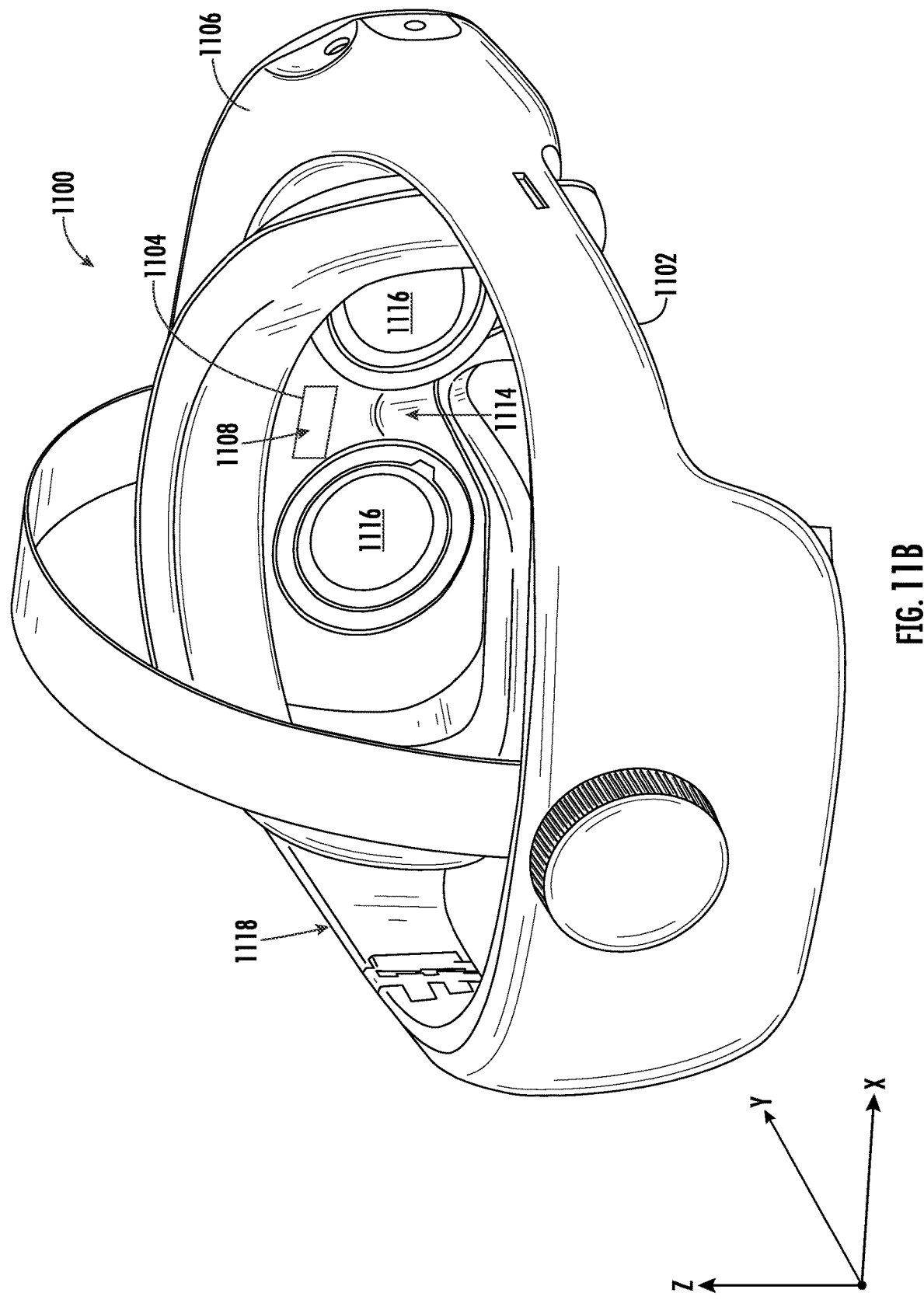

In another example, FIGS. 11A and 11B are front perspective and rear perspective views, respectively, of another wearable device 1100 in the form of head-mounted virtual reality (VR) display device 1102 designed to be worn by a user and that includes a sensor IC 1104 mounted in a head visor 1106 of the head-mounted VR display device 1102. The sensor IC 1104 can be any of the sensor ICs 200, 500, 600, 700, 800 in FIGS. 2A-2B and 4-8 as examples. The sensor IC 1104 includes an opposite facing proximity sensor 1108 and an ambient light sensor 1110 to reduce or avoid the ambient light sensor 1110 receiving light emitted from the proximity sensor. As shown in FIG. 11A in the front view of the head-mounted VR display device 1102, the ambient light sensor 1110 is adjacent to, exposed, and facing outward from the front side 1112 of the head-mounted VR display device 1102 so that the ambient light sensor 1110 receives ambient light in the same direction as would be perceived by a user wearing the head-mounted VR display device 1102. As shown in FIG. 11B in the rear view of the head-mounted VR display device 1102, the proximity sensor 1108 is adjacent to, exposed, and facing outward from a rear side 1114 of the head-mounted VR display device 1102 so that the proximity sensor 1108 can detect when a user places the head-mounted VR display device 1102 close to them when about to wear or wearing the head-mounted VR display device 1102. The orientation of the proximity sensor 1108 and ambient light sensor 1110 being disposed on opposite sides of the sensor IC 1104 is particularly advantageous in this arrangement of head-mounted VR display device 1102, because the desired orientation is for the proximity sensor 1108 to be exposed and facing outward from a rear side 1114 of the head-mounted VR display device 1102 and for the ambient light sensor 1110 to be exposed and facing outward from the front side 1112 of the head-mounted VR display device 1102. Thus, the proximity sensor 1108 and ambient light sensor 1110 already being disposed on opposite sides of the sensor IC 1104 means that the sensor IC 1104 can be integrated into the head-mounted VR display device 1102 without having to route or re-route interfaces to the proximity sensor 1108 or ambient light sensor 1110 if such were not located on opposite sides of the sensor IC 1104.

The head-mounted VR display device 1102 may have an integrated display 1116 shown in FIG. 11B that can be controlled by an electronic device 1118. The electronic device 1118 is also interfaced to the sensor IC 1104 so that the electronic device 1118 retrieves or receives ambient light information from the sensor IC 1104 indicative of the amount of ambient light detected by the ambient light sensor 1110. The electronic device 1118 may be configured to brightness of the display 1116 based on the ambient light information. For example, the electronic device 1118 may reduce the brightness of the display 1116 as a function of an increase in the amount of ambient light detected. The electronic device 1118 is also configured to retrieve or receive proximity information from the sensor IC 1104 indicative of the proximity of an object detected by the proximity sensor 1108. The electronic device 1118 may also be configured to control an operational mode of the electronic device 1118 based on the proximity information. For example, the electronic device 1118 may cause the electronic device 918 to enter into an idle or sleep mode with reduced functionality to reduce power consumption when an object (e.g., a user) is not detected based on the proximity information. The electronic device 1118 may cause the electronic device 1118 to enter into an active or awake mode with increased functionality that causes more power to be consumed when an object (e.g., a user) is detected based on the proximity information.

Figure 12:
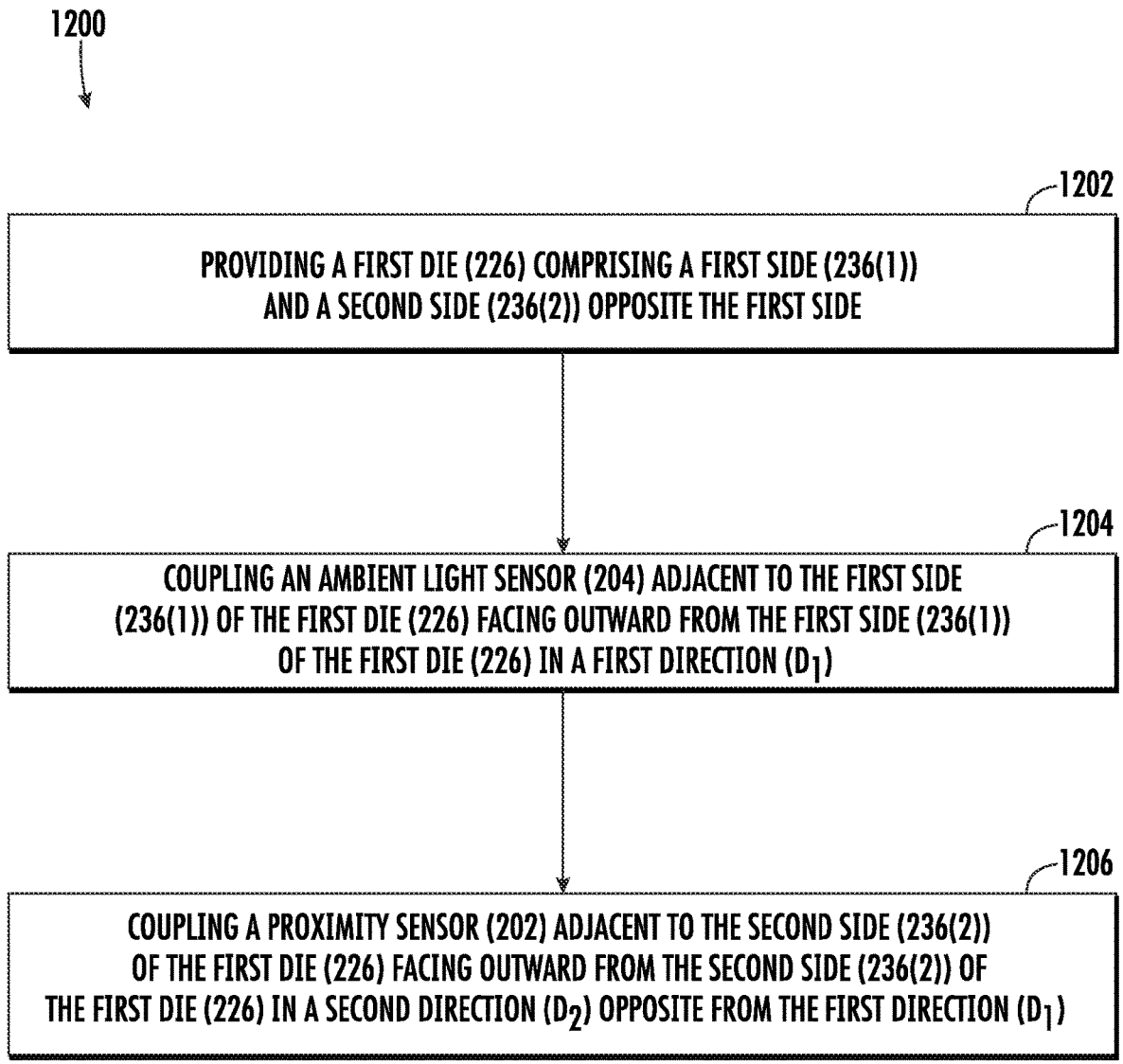
FIG. 12 is flowchart illustrating an exemplary fabrication process of fabricating a sensor IC that includes an opposite facing proximity sensor and an ambient light sensor, including but not limited to the sensor ICs in FIGS. 2A-2B and 4-8.

Fabrication processes can be employed to fabricate a sensor IC that includes an opposite facing proximity sensor and an ambient light sensor, including but not limited to the sensor ICs 200, 400, 500, 600, 700, and 800 in FIGS. 2A-2B and 4-8. In this regard, FIG. 12 is a flowchart illustrating an exemplary fabrication process 1200 of fabricating a sensor IC that includes an opposite facing proximity sensor and an ambient light sensor, including but not limited to the sensor ICs 200, 400, 500, 600, 700, and 800 in FIGS. 2A-2B and 4-8. The fabrication process 1200 in FIG. 12 is discussed with regard to the sensor IC 200 in FIG. 2, but note that the fabrication process 1200 is not limited to fabricating a sensor IC like the sensor IC 200 in FIG. 2. The fabrication process 1200 in FIG. 12 could be used to fabricate the sensor ICs 400, 600, 700, 800 in FIGS. 4 and 6-8.

In this regard, as shown in FIG. 12, a first step of the fabrication process 1200 in this example is providing a first die 226 comprising a first side 236(1) and a second side 236(2) opposite the first side (block 1202 in FIG. 12). A next step of the fabrication process 1200 in this example is coupling an ambient light sensor 204 adjacent to the first side 236(1) of the first die 226 facing outward from the first side 236(1) of the first die 226 in a first direction $D_1$ (block 1204 in FIG. 12). A next step of the fabrication process 1200 in this example is coupling a proximity sensor 202 adjacent to the second side 236(2) of the first die 226 facing outward from the second side 236(2)) of the first die 226 in a second direction $D_2$ opposite from the first direction $D_1$ (block 1206 in FIG. 12).

Figure 13C:
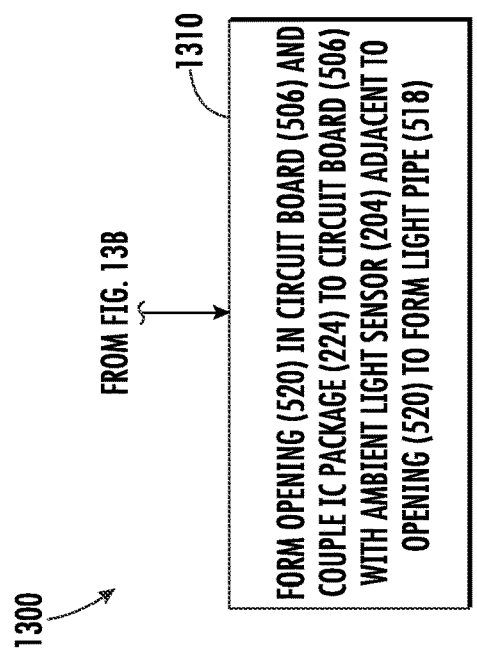

Other fabrication processes can also be employed to fabricate a sensor IC that includes an opposite facing proximity sensor and an ambient light sensor, including but not limited to the sensor ICs 200, 400, 500, 600, 700, and 800 in FIGS. 2A-2B and 4-8. In this regard, FIGS. 13A-13C is a flowchart illustrating another exemplary fabrication process 1300 of fabricating a sensor IC that includes an opposite facing proximity sensor and an ambient light sensor, including but not limited to sensor ICs 200, 400, 500, 600, 700, and 800 in FIGS. 2A-2B and 4-8. FIGS. 14A-14E are exemplary fabrication stages 1400A-1400E during fabrication of a sensor IC according to the fabrication process 1300 in FIGS. 13A-13C. The fabrication process 1400 in FIGS. 13A-13C, and as shown in the fabrication stages 1400A-1400E in FIGS. 14A-14E, are discussed in reference to the sensor IC 400 in FIG. 4, but note that such is not limiting. The fabrication process 1200 in FIG. 12 could be used to fabricate the sensor ICs 200, 600, 700, 800 in FIGS. 2 and 6-8.

Figure 14E:
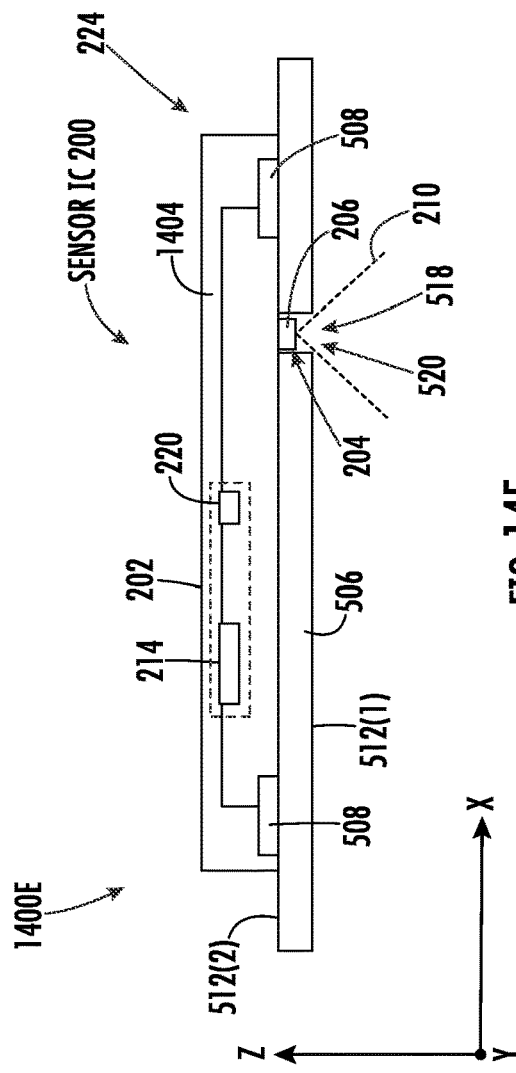

In this regard, as shown in the fabrication stage 1400A in FIG. 14A, the second die 504(2) that includes the proximity sensor 202 is prepared (block 1302 in FIG. 13A). The light emitter 214 and proximity light receiver 220 of the proximity sensor 202 are disposed on the second side 511(2) of the second die 504(2). A light resistant resin 1402 is also disposed in the second die 504(2) adjacent to the second side 511(2) of the second die 504(2) to provide a light barrier between the light emitter 214 and the proximity light receiver 220. Then, as shown in the fabrication stage 1400B in FIG. 14B, the first die 504(1) that includes the ambient light sensor 204 is prepared (block 1304 in FIG. 13A). The visible light receiver 206 of the ambient light sensor 204 is disposed on the first side 510(1) of the first die 504(1). Then, as shown in the fabrication stage 1400C in FIG. 14C, the second die 504(2) is coupled to the first die 504(1) in the vertical direction (Z-axis direction) such that the second die 504(2) is stacked above the first die 504(1) (block 1306 in FIG. 13B). Then, as shown in the fabrication stage 1400D in FIG. 14D, pins 508 are formed and coupled to the first and second dies 504(1), 504(2) to provide interconnects to the first and second dies 504(1), 504(2) (block 1308 in FIG. 13B). An overmold material 1404 is disposed around the first and second dies 504(1), 504(2) and the pins 508 to form the IC package 224 of the sensor IC 200 (block 1308 in FIG. 13B). Then, as shown in the fabrication stage 1400E in FIG. 14E, the opening 520 is formed in the circuit board 506, and the IC package 224 of the sensor IC 200 is mounted to the circuit board 506 (block 1310 in FIG. 13C). The IC package 224 is coupled to the second surface 512(2) of the circuit board 506 such that the ambient light sensor 204 is disposed adjacent to the opening 520 so that the opening 520 forms the light pipe 518 for the ambient light sensor 204 and provides an ambient field of view 210 for the ambient light sensor 204 (block 1310 in FIG. 13C).

Note that the term "inward" and "outward" are relative terms and not necessarily limited to an external or internal component. Also note that a component described as "mounted," "coupled," and "disposed on" herein is not limited to such component being directly or indirectly attached or coupled.

A sensor IC that includes an opposite facing proximity sensor and an ambient light sensor, including but not limited to the sensor ICs 200, 400, 500, 600, 700, 800, in FIGS. 2A-2B, 4-8, and 14A-14E, and fabricated according to a fabrication process, including but not limited to the exemplary fabrication processes 1200, 1300 in FIGS. 12-13C, and according to any aspects disclosed herein, may be provided in or integrated into any processor-based device. Examples, without limitation, include glasses, including XR glasses, a head-mounted display device, an electronic watch, a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, laptop computer, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, and a vehicle component.

Figure 15:
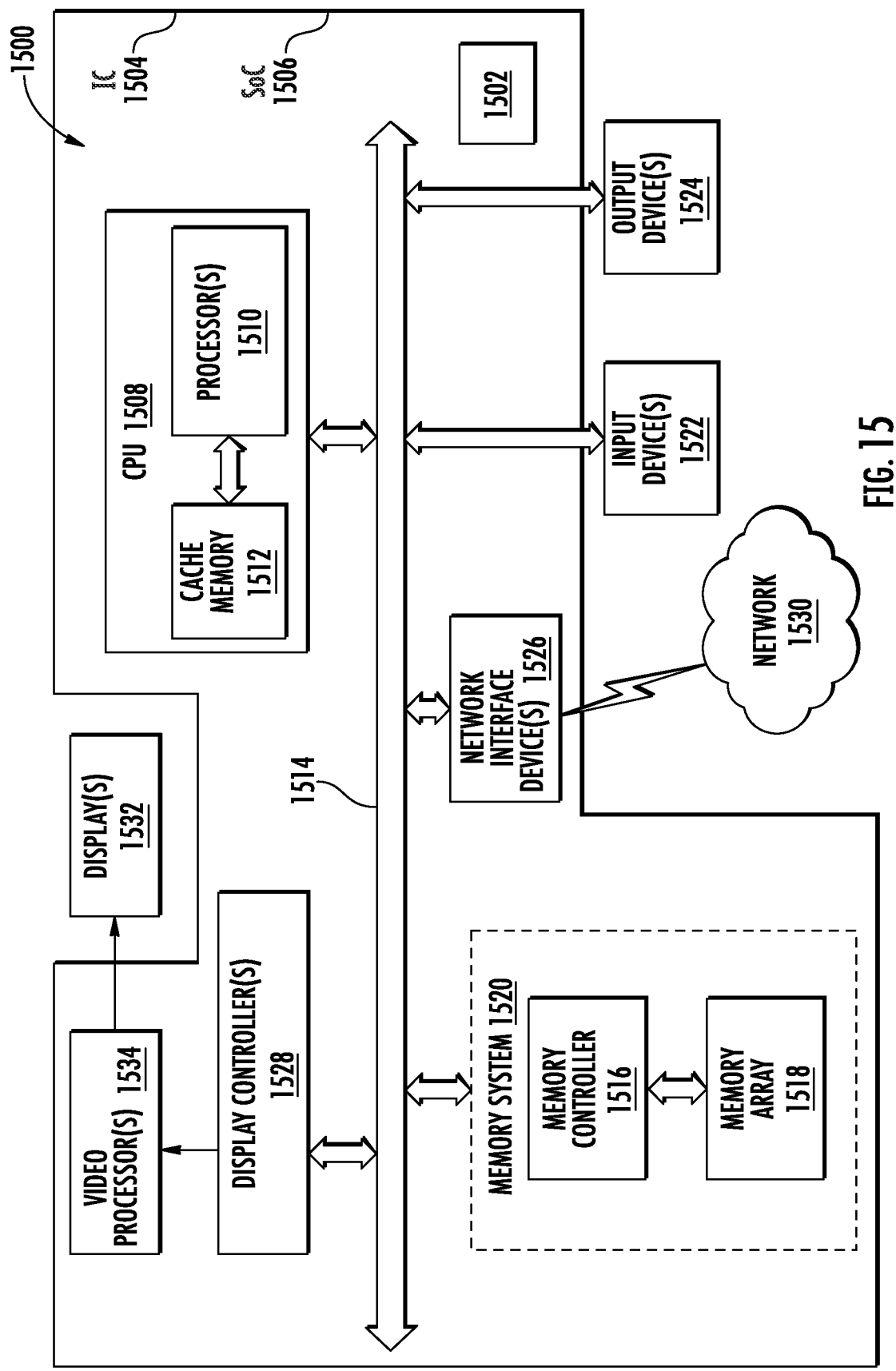
FIG. 15 is a block diagram of an exemplary electronic device in the form of a processor-based system that can include a sensor IC that includes an opposite facing proximity sensor and an ambient light sensor, including but not limited to the sensor ICs in FIGS. 2A-2B and 4-8, and fabricated according to a fabrication process, including but not limited to the exemplary fabrication processes in FIGS. 12-13C.

In this regard, FIG. 15 illustrates an example of a processor-based system 1500 that can include a sensor IC 1502 that includes an opposite facing proximity sensor and an ambient light sensor, including but not limited to sensor ICs 200, 400, 500, 600, 700, 800 in FIGS. 2A-2B, 4-8, and 14A-14E, and fabricated according to a fabrication process, including but not limited to the exemplary fabrication processes 1200, 1300 in FIGS. 12-13C, and according to any aspects disclosed herein. For example, the processor-based system 1500 may be integrated into a mobile device, including a wearable device, such as XR glasses or other device(s). In this example, the processor-based system 1500 may be formed as an IC 1504, and as part of an IC package such as system-on-a-chip (SoC) 1506. The processor-based system 1500 includes a central processing unit (CPU) 1508 that includes one or more processors 1510, which may also be referred to as CPU cores or processor cores. The CPU 1508 may have cache memory 1512 coupled to the CPU 1508 for rapid access to temporarily stored data. The CPU 1508 is coupled to a system bus 1514 and can intercouple master and slave devices included in the processor-based system 1500. As is well known, the CPU 1508 communicates with these other devices by exchanging address, control, and data information over the system bus 1514. For example, the CPU 1508 can communicate bus transaction requests to a memory controller 1516, as an example of a slave device. Although not illustrated in FIG. 15, multiple system buses 1514 could be provided, wherein each system bus 1514 constitutes a different fabric.

Other master and slave devices can be connected to the system bus 1514. As illustrated in FIG. 15, these devices can include a memory system 1520 that includes the memory controller 1516 and a memory array(s) 1518, one or more input devices 1522, one or more output devices 1524, one or more network interface devices 1526, and one or more display controllers 1528, as examples. The input device(s) 1522 can include any type of input device, including, but not limited to, input keys, switches, voice processors, etc. The output device(s) 1524 can include any type of output device, including, but not limited to, audio, video, other visual indicators, etc. The network interface device(s) 1526 can be any device configured to allow exchange of data to and from a network 1530. The network 1530 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1526 can be configured to support any type of communications protocol desired.

The CPU 1508 may also be configured to access the display controller(s) 1528 over the system bus 1514 to control information sent to one or more displays 1532. The display controller(s) 1528 sends information to the display(s) 1532 to be displayed via one or more video processor(s) 1534, which process the information to be displayed into a format suitable for the display(s) 1532. The display(s) 1532 can include any type of display, including, but not limited to, a cathode ray tube (CRT), a liquid crystal display (LCD), a plasma display, a light emitting diode (LED) display, etc.

The CPU 1508 and/or the display controller 1528 in the processor-based system 1500 can use information received from the sensor IC 1502 to control the brightness of the display 1532 based on ambient lighting conditions detected by an ambient light sensor in the sensor IC 1502. The CPU 1508 and/or the display controller 1528 can also control its operating mode based on the proximity sensor in the sensor IC 1502 detecting the user as an object.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

Implementation examples are described in the following numbered clauses:

1. An integrated circuit (IC), comprising:
   a first die comprising a first side and a second side opposite the first side;
   an ambient light sensor adjacent to the first side of the first die, the ambient light sensor facing outward from the first side of the first die in a first direction; and
   a proximity sensor adjacent to the second side of the first die, the proximity sensor facing outward from the second side of the first die in a second direction opposite from the first direction.
2. The IC of clause 1, wherein:
   the ambient light sensor is configured to receive visible light in an ambient field of view in the second direction towards the first side of the first die; and
   the proximity sensor is configured to:
      emit a first light in an emission field in the first direction outward from the second side of the first die; and
      receive at least a portion of the first light returned in a proximity field of view in the second direction towards the second side of the first die.
3. The IC of clause 1 or 2, wherein:
   the ambient light sensor is coupled to the first side of the first die; and
   the proximity sensor is coupled to the second side of the first die.
4. The IC of clause 3, further comprising a circuit board comprising a first surface and a second surface opposite of the first surface;
   wherein:
      the first side of the first die is adjacent to the first surface of the circuit board;
      the circuit board further comprises a light pipe comprising a first opening extending from the first surface to the second surface of the circuit board; and
      the ambient light sensor is adjacent to the first opening.
5. The IC of clause 4, wherein:
   the first opening has a first diameter creating an ambient field of view in the second direction towards the first side of the first die; and
   the ambient light sensor is configured to receive visible light in the ambient field of view through the first opening.
6. The IC of clause 1 or 2, further comprising a second die comprising a third side and a fourth side opposite the third side; and
   wherein:
      the ambient light sensor is coupled to the first side of the first die; and
      the proximity sensor is coupled to the second side of the second die.
7. The IC of clause 6, further comprising a circuit board comprising a first surface and a second surface opposite of the first surface;
   wherein:
      the first side of the first die is adjacent to the first surface of the circuit board;
      the circuit board further comprises a light pipe comprising a first opening extending from the first surface to the second surface of the circuit board; and
      the ambient light sensor is adjacent to the first opening.
8. The IC of clause 7, wherein:
   the first opening has a first diameter creating an ambient field of view in the second direction towards the first side of the first die; and
   the ambient light sensor is configured to receive visible light in the ambient field of view through the first opening.
9. The IC of any of clauses 6-8, wherein the third side of the second die is adjacent to the second side of the first die in a vertical direction.
10. The IC of clause 9, further comprising a first circuit board comprising a first surface and a second surface opposite of the first surface;
    wherein:
       the first side of the first die is adjacent to the first surface of the first circuit board;
       the first circuit board further comprises a light pipe comprising a first opening extending from the first surface to the second surface of the first circuit board; and
    the ambient light sensor is adjacent to the first opening.
11. The IC of clause 10, wherein:
    the first opening has a first diameter creating an ambient field of view in the second direction towards the first side of the first die; and
    the ambient light sensor is configured to receive visible light in the ambient field of view through the first opening.
12. The IC of any of clauses 6-8, further comprising a first circuit board comprising a first surface and a second surface opposite of the first surface;
    wherein:
       the first side of the first die is adjacent to the first surface of the first circuit board;
       the third side of the second die is adjacent to the first surface of the first circuit board and adjacent to the first die;
       the first circuit board further comprises a first light pipe comprising a first opening extending from the first surface to the second surface of the first circuit board; and
    the ambient light sensor is adjacent to the first opening.
13. The IC of clause 12, wherein:
    the first opening has a first diameter creating an ambient field of view in the second direction towards the first side of the first die; and
    the ambient light sensor is configured to receive visible light in the ambient field of view through the first opening.
14. The IC of clause 10 or 11, further comprising:
    a second circuit board comprising a third surface and a fourth surface opposite of the third surface;
    wherein:
       the fourth surface of the second circuit board is adjacent to the first surface of the first circuit board;
       the second circuit board further comprises a second light pipe comprising a second opening extending from the third surface to the fourth surface of the second circuit board; and
       the first opening is at least partially aligned to the second opening in the vertical direction.
15. The IC of clause 14, wherein:
    the first opening has a first diameter and the second opening has a second diameter creating an ambient field of view in the second direction towards the first side of the first die; and
    the ambient light sensor is configured to receive visible light in the ambient field of view through the first opening and the second opening.

16. The IC of clause 10 or 11, further comprising a second circuit board comprising a third surface and a fourth surface opposite of the third surface;
wherein:
the third surface of the second circuit board is adjacent to the second side of the second die;
the second circuit board further comprises:
a second light pipe comprising a second opening extending from the third surface to the fourth surface of the second circuit board; and
a third light pipe comprising a third opening extending from the third surface to the fourth surface of the second circuit board; and
the proximity sensor comprises:
a light emitter adjacent to the second opening in the second circuit board; and
a light receiver adjacent to the third opening in the second circuit board.

17. The IC of clause 16, wherein:
the second opening has a second diameter creating an emission field;
the second opening has a third diameter creating a second field of view in the first direction towards the second side of the first die;
the ambient light sensor is configured to receive visible light in an ambient field of view through the first opening;
the light emitter is configured to emit light in the emission field in the second direction outward from the second side of the first die through the second opening; and
the light receiver is configured to receive a second light in the second field of view through the third opening.

18. The IC of any of clauses 2-17, wherein:
the ambient light sensor comprises a visible light receiver configured to detect the visible light in the ambient field of view in the first direction towards the first side of the first die; and
the proximity sensor comprises:
an infrared light emitter configured to emit the first light comprising a first infrared (IR) light in the emission field in the second direction outwards from the second side of the first die; and
an IR light receiver configured to detect the at least a portion of the first IR light comprising at least a portion of the first IR light returned in the proximity field of view in the first direction towards the second side of the first die.

19. The IC of clause 18, wherein the ambient light sensor further comprises a second IR light receiver configured to detect an ambient IR light.

20. The IC of any of clauses 1-19 integrated into a device selected from the group consisting of: glasses, XR glasses, a head-mounted display device, an electronic watch; a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; and a vehicle component.

21. A method of fabricating an integrated circuit (IC), comprising:
providing a first die comprising a first side and a second side opposite the first side;
coupling an ambient light sensor adjacent to the first side of the first die facing outward from the first side of the first die in a first direction; and
coupling a proximity sensor adjacent to the second side of the first die facing outward from the second side of the first die in a second direction opposite from the first direction.

22. The method of clause 21, further comprising:
providing a circuit board comprising a first surface and a second surface opposite of the first surface;
forming a light pipe comprising an opening in the circuit board extending from the first surface to the second surface of the circuit board; and
coupling the first die adjacent to the first surface of the circuit board such that the ambient light sensor is adjacent to the opening.

23. The method of clause 21 or 22, further comprising:
providing a second die comprising a third side and a fourth side opposite the third side; and
wherein:
coupling the ambient light sensor comprises coupling the ambient light sensor to the first side of the first die facing outward from the first side of the first die in the first direction; and
coupling the proximity sensor comprises coupling the proximity sensor to the second side of the second die facing outward from the second side of the second die in the second direction opposite from the first direction.

24. The method of clause 23, further comprising coupling the third side of the second die adjacent to the second side of the first die in a vertical direction.

25. The method of clause 23, further comprising
providing a first circuit board comprising a first surface and a second surface opposite of the first surface;
coupling the first side of the first die adjacent to the first surface of the first circuit board; and
coupling the third side of the second die is adjacent to the first surface of the first circuit board and adjacent to the first die.

26. The IC of clause 21, further comprising:
providing a first circuit board comprising a first surface and a second surface opposite of the first surface; and
providing a second circuit board comprising a third surface and a fourth surface opposite of the third surface;
wherein:
coupling the ambient light sensor further comprises coupling the ambient light sensor adjacent to the second surface of the first circuit board; and
coupling the proximity sensor further comprises coupling the proximity sensor adjacent to the second surface of the first circuit board; and
further comprising:
forming a first light pipe comprising a first opening in the first circuit board extending from the first surface to the second surface of the first circuit board;
forming a second light pipe comprising a second opening in the second circuit board extending from the third surface to the fourth surface of the second circuit board;
disposing the fourth surface of the second circuit board adjacent to the first surface of the first circuit board such that the first opening and the second opening are at least partially aligned in a vertical direction; and coupling the first die adjacent to the first surface of the first circuit board such that the ambient light sensor is adjacent to the first opening.

27. The method of clause 23, further comprising:

providing a first circuit board comprising a first surface and a second surface opposite of the first surface; and providing a second circuit board comprising a third surface and a fourth surface opposite of the third surface;

forming a first light pipe comprising a first opening in the first circuit board extending from the first surface to the second surface of the first circuit board;

forming a second light pipe comprising a second opening extending from the third surface to the fourth surface of the second circuit board;

forming a third light pipe comprising a third opening extending from the third surface to the fourth surface of the second circuit board;

disposing the third surface of the second circuit board adjacent to the second surface of the first circuit board;

coupling the first die adjacent to the first surface of the first circuit board such that the ambient light sensor is adjacent to the first opening; and coupling the second die adjacent to the fourth surface of the second circuit board such that a light emitter of the proximity sensor is adjacent to the second opening and a light receiver of the proximity sensor is adjacent to the third opening.

28. An electronic device, comprising:

a computing device;

a display coupled to the computing device;

an integrated circuit (IC) coupled to the computing device, the IC comprising:

a first die comprising a first side and a second side opposite the first side;

an ambient light sensor adjacent to the first side of the first die, the ambient light sensor facing outward from the first side of the first die in a first direction; and a proximity sensor adjacent to the second side of the first die, the proximity sensor facing outward from the second side of the first die in a second direction opposite from the first direction;

wherein:

the ambient light sensor configured to:

receive visible light in an ambient field of view in the second direction towards the first side of the first die; and generate an ambient light signal comprising ambient light information indicating an amount of received visible light;

the proximity sensor configured to:

emit a first light in an emission field in the first direction outward from the second side of the first die;

receive at least a portion of the first light returned in a proximity field of view in the second direction towards the second side of the first die; and generate a proximity signal comprising proximity information indicating a proximity of an object to the IC; and the computing device is configured to:

receive the ambient light signal;

control a brightness of the display based on the ambient light information in the ambient light signal;

receive the proximity signal; and control an operational mode of the computing device based on the proximity information in the proximity signal.

29. The electronic device of clause 28, wherein the IC further comprises:

an interface circuit coupled to the computing device;

a switch configured to receive the ambient light signal and the proximity signal, and an output coupled to the interface circuit; and a selection logic circuit coupled to the switch, the selection logic circuit configured to pass one of the ambient light signal and the proximity signal to the output.

30. The electronic device of clause 28 or 29, comprising wearable glasses.

31. The electronic device of clause 30, wherein the wearable glasses further comprise a nose bridge comprising a third side and a fourth side opposite the third side; wherein the fourth side is configured to be adjacent a user wearing the wearable glasses;

wherein the IC is coupled to the nose bridge such that the first side of the first die is adjacent to the third side of the nose bridge and the second side of the first die is adjacent to the fourth side of the nose bridge.

32. The electronic device of clause 30, wherein the wearable glasses further comprise an arm comprising a third side and a fourth side opposite the third side, wherein the fourth side is configured to be adjacent a user wearing the wearable glasses;

wherein the IC is coupled to the arm such that the first side of the first die is adjacent to the third side of the arm and the second side of the first die is adjacent to the fourth side of the arm.

33. The electronic device of clause 28 comprising a head-mounted display device.

34. The electronic device of clause 33, wherein the head-mounted display device comprises a head visor comprising a third side and a fourth side opposite the first side, wherein the fourth side is configured to be adjacent a user wearing the head-mounted display;

wherein the IC is coupled to the head visor such that the first side of the first die is adjacent to the third side of the head visor and the second side of the first die is adjacent to the fourth side of the head visor.

What is claimed is:

1. An integrated circuit (IC), comprising:

a first die comprising a first side and a second side opposite the first side;

an ambient light sensor coupled to the first side of the first die, the ambient light sensor facing outward from the first side of the first die in a first direction; and a proximity sensor coupled to the second side of the first die, the proximity sensor facing outward from the second side of the first die in a second direction opposite from the first direction.

2. The IC of claim 1, wherein:

the ambient light sensor is configured to receive visible light in an ambient field of view in the second direction towards the first side of the first die; and the proximity sensor is configured to:

emit a first light in an emission field in the first direction outward from the second side of the first die; and receive at least a portion of the first light returned in a proximity field of view in the second direction towards the second side of the first die.

3. The IC of claim 1, wherein:
the ambient light sensor is coupled to the first side of the first die; and
the proximity sensor is coupled to the second side of the first die.

4. The IC of claim 3, further comprising a circuit board comprising a first surface and a second surface opposite of the first surface;
wherein:
the first side of the first die is adjacent to the first surface of the circuit board;
the circuit board further comprises a light pipe comprising a first opening extending from the first surface to the second surface of the circuit board; and
the ambient light sensor is adjacent to the first opening.

5. The IC of claim 4, wherein:
the first opening has a first diameter creating an ambient field of view in the second direction towards the first side of the first die; and
the ambient light sensor is configured to receive visible light in the ambient field of view through the first opening.

6. The IC of claim 1, further comprising a second die comprising a third side and a fourth side opposite the third side; and
wherein:
the ambient light sensor is coupled to the first side of the first die; and
the proximity sensor is coupled to the fourth side of the second die.

7. The IC of claim 6, further comprising a circuit board comprising a first surface and a second surface opposite of the first surface;
wherein:
the first side of the first die is adjacent to the first surface of the circuit board;
the circuit board further comprises a light pipe comprising a first opening extending from the first surface to the second surface of the circuit board; and
the ambient light sensor is adjacent to the first opening.

8. The IC of claim 7, wherein:
the first opening has a first diameter creating an ambient field of view in the second direction towards the first side of the first die; and
the ambient light sensor is configured to receive visible light in the ambient field of view through the first opening.

9. The IC of claim 6, wherein the third side of the second die is adjacent to the second side of the first die in a vertical direction.

10. The IC of claim 9, further comprising a first circuit board comprising a first surface and a second surface opposite of the first surface;
wherein:
the first side of the first die is adjacent to the first surface of the first circuit board;
the first circuit board further comprises a light pipe comprising a first opening extending from the first surface to the second surface of the first circuit board; and
the ambient light sensor is adjacent to the first opening.

11. The IC of claim 10, wherein:
the first opening has a first diameter creating an ambient field of view in the second direction towards the first side of the first die; and
the ambient light sensor is configured to receive visible light in the ambient field of view through the first opening.

12. The IC of claim 6, further comprising a first circuit board comprising a first surface and a second surface opposite of the first surface;
wherein:
the first side of the first die is adjacent to the first surface of the first circuit board;
the third side of the second die is adjacent to the first surface of the first circuit board and adjacent to the first die;
the first circuit board further comprises a first light pipe comprising a first opening extending from the first surface to the second surface of the first circuit board; and
the ambient light sensor is adjacent to the first opening.

13. The IC of claim 12, wherein:
the first opening has a first diameter creating an ambient field of view in the second direction towards the first side of the first die; and
the ambient light sensor is configured to receive visible light in the ambient field of view through the first opening.

14. The IC of claim 10, further comprising:
a second circuit board comprising a third surface and a fourth surface opposite of the third surface;
wherein:
the fourth surface of the second circuit board is adjacent to the first surface of the first circuit board;
the second circuit board further comprises a second light pipe comprising a second opening extending from the third surface to the fourth surface of the second circuit board; and
the first opening is at least partially aligned to the second opening in the vertical direction.

15. The IC of claim 14, wherein:
the first opening has a first diameter and the second opening has a second diameter creating an ambient field of view in the second direction towards the first side of the first die; and
the ambient light sensor is configured to receive visible light in the ambient field of view through the first opening and the second opening.

16. The IC of claim 10, further comprising a second circuit board comprising a third surface and a fourth surface opposite of the third surface;
wherein:
the third surface of the second circuit board is adjacent to the fourth side of the second die;
the second circuit board further comprises:
a second light pipe comprising a second opening extending from the third surface to the fourth surface of the second circuit board; and
a third light pipe comprising a third opening extending from the third surface to the fourth surface of the second circuit board; and
the proximity sensor comprises:
a light emitter adjacent to the second opening in the second circuit board; and
a light receiver adjacent to the third opening in the second circuit board.

17. The IC of claim 16, wherein:
the second opening has a second diameter creating an emission field;
the third opening has a third diameter creating a second field of view in the first direction towards the second side of the first die;
the ambient light sensor is configured to receive visible light in an ambient field of view through the first opening;
the light emitter is configured to emit light in the emission field in the second direction outward from the second side of the first die through the second opening; and
the light receiver is configured to receive a second light in the second field of view through the third opening.

18. The IC of claim 2, wherein:
the ambient light sensor comprises a visible light receiver configured to detect the visible light in the ambient field of view in the first direction towards the first side of the first die; and
the proximity sensor comprises:
an infrared light emitter configured to emit the first light comprising a first infrared (IR) light in the emission field in the second direction outwards from the second side of the first die; and
an IR light receiver configured to detect the portion of the first light comprising at least a portion of the first IR light returned in the proximity field of view in the first direction towards the second side of the first die.

19. The IC of claim 18, wherein the ambient light sensor further comprises a second IR light receiver configured to detect an ambient IR light.

20. The IC of claim 1 integrated into a device selected from the group consisting of: glasses, XR glasses, a head-mounted display device, an electronic watch; a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; and a vehicle component.

21. A method of fabricating an integrated circuit (IC), comprising:
providing a first die comprising a first side and a second side opposite the first side;
coupling an ambient light sensor to the first side of the first die facing outward from the first side of the first die in a first direction; and
coupling a proximity sensor to the second side of the first die facing outward from the second side of the first die in a second direction opposite from the first direction.

22. The method of claim 21, further comprising:
providing a circuit board comprising a first surface and a second surface opposite of the first surface;
forming a light pipe comprising an opening in the circuit board extending from the first surface to the second surface of the circuit board; and
coupling the first die to the first surface of the circuit board such that the ambient light sensor is adjacent to the opening.

23. The method of claim 21, further comprising:
providing a second die comprising a third side and a fourth side opposite the third side; and
wherein:
coupling the ambient light sensor comprises coupling the ambient light sensor to the first side of the first die facing outward from the first side of the first die in the first direction; and
coupling the proximity sensor comprises coupling the proximity sensor to the fourth side of the second die facing outward from the fourth side of the second die in the second direction opposite from the first direction.

24. The method of claim 23, further comprising coupling the third side of the second die to the second side of the first die in a vertical direction.

25. The method of claim 23, further comprising
providing a first circuit board comprising a first surface and a second surface opposite of the first surface;
coupling the first side of the first die to the first surface of the first circuit board; and
coupling the third side of the second die to the first surface of the first circuit board and adjacent to the first die.

26. The method of claim 21, further comprising:
providing a first circuit board comprising a first surface and a second surface opposite of the first surface; and
providing a second circuit board comprising a third surface and a fourth surface opposite of the third surface;
wherein:
coupling the ambient light sensor further comprises coupling the ambient light sensor to the second surface of the first circuit board; and
coupling the proximity sensor further comprises coupling the proximity sensor to the second surface of the first circuit board; and
further comprising:
forming a first light pipe comprising a first opening in the first circuit board extending from the first surface to the second surface of the first circuit board;
forming a second light pipe comprising a second opening in the second circuit board extending from the third surface to the fourth surface of the second circuit board;
disposing the fourth surface of the second circuit board adjacent to the first surface of the first circuit board such that the first opening and the second opening are at least partially aligned in a vertical direction; and
coupling the first die to the first surface of the first circuit board such that the ambient light sensor is adjacent to the first opening.

27. The method of claim 23, further comprising:
providing a first circuit board comprising a first surface and a second surface opposite of the first surface; and
providing a second circuit board comprising a third surface and a fourth surface opposite of the third surface;
forming a first light pipe comprising a first opening in the first circuit board extending from the first surface to the second surface of the first circuit board;
forming a second light pipe comprising a second opening extending from the third surface to the fourth surface of the second circuit board;
forming a third light pipe comprising a third opening extending from the third surface to the fourth surface of the second circuit board;
disposing the third surface of the second circuit board adjacent to the second surface of the first circuit board;

coupling the first die to the first surface of the first circuit board such that the ambient light sensor is adjacent to the first opening; and coupling the second die to the fourth surface of the second circuit board such that a light emitter of the proximity sensor is adjacent to the second opening and a light receiver of the proximity sensor is adjacent to the third opening.

28. An electronic device, comprising:

a computing device;

a display coupled to the computing device;

an integrated circuit (IC) coupled to the computing device, the IC comprising:

a first die comprising a first side and a second side opposite the first side;

an ambient light sensor coupled to the first side of the first die, the ambient light sensor facing outward from the first side of the first die in a first direction; and a proximity sensor coupled to the second side of the first die, the proximity sensor facing outward from the second side of the first die in a second direction opposite from the first direction;

wherein:

the ambient light sensor is configured to:

receive visible light in an ambient field of view in the second direction towards the first side of the first die; and generate an ambient light signal comprising ambient light information indicating an amount of received visible light;

the proximity sensor is configured to:

emit a first light in an emission field in the first direction outward from the second side of the first die;

receive at least a portion of the first light returned in a proximity field of view in the second direction towards the second side of the first die; and generate a proximity signal comprising proximity information indicating a proximity of an object to the IC; and the computing device is configured to:

receive the ambient light signal;

control a brightness of the display based on the ambient light information in the ambient light signal;

receive the proximity signal; and control an operational mode of the computing device based on the proximity information in the proximity signal.

29. The electronic device of claim 28, wherein the IC further comprises:

an interface circuit coupled to the computing device;

a switch configured to receive the ambient light signal and the proximity signal, and an output coupled to the interface circuit; and a selection logic circuit coupled to the switch, the selection logic circuit configured to pass one of the ambient light signal and the proximity signal to the output.

30. The electronic device of claim 28, comprising wearable glasses.

31. The electronic device of claim 30, wherein the wearable glasses further comprise a nose bridge comprising a third side and a fourth side opposite the third side; wherein the fourth side is configured to be adjacent a user wearing the wearable glasses;

wherein the IC is coupled to the nose bridge such that the first side of the first die is adjacent to the third side of the nose bridge and the second side of the first die is adjacent to the fourth side of the nose bridge.

32. The electronic device of claim 30, wherein the wearable glasses further comprise an arm comprising a third side and a fourth side opposite the third side, wherein the fourth side is configured to be adjacent a user wearing the wearable glasses;

wherein the IC is coupled to the arm such that the first side of the first die is adjacent to the third side of the arm and the second side of the first die is adjacent to the fourth side of the arm.

33. The electronic device of claim 28 comprising a head-mounted display device.

34. The electronic device of claim 33, wherein the head-mounted display device comprises a head visor comprising a third side and a fourth side opposite the third side, wherein the fourth side is configured to be adjacent a user wearing the head-mounted display;

wherein the IC is coupled to the head visor such that the first side of the first die is adjacent to the third side of the head visor and the second side of the first die is adjacent to the fourth side of the head visor.

\* \* \* \* \*